United States Patent
Greene et al.

(10) Patent No.: US 11,039,524 B2
(45) Date of Patent: Jun. 15, 2021

(54) AUTOMATED SYSTEM FOR LIGHTING CONTROL

(71) Applicant: Powercast Corporation, Pittsburgh, PA (US)

(72) Inventors: Charles E. Greene, Cabot, PA (US); Daniel W. Harrist, Carnegie, PA (US)

(73) Assignee: Powercast Corporation, Pittsburgh, PA (US)

( * ) Notice: Subject to any disclaimer, the term of this patent is extended or adjusted under 35 U.S.C. 154(b) by 0 days.

(21) Appl. No.: 16/725,749

(22) Filed: Dec. 23, 2019

(65) Prior Publication Data
US 2020/0214113 A1   Jul. 2, 2020

Related U.S. Application Data

(63) Continuation of application No. 16/208,382, filed on Dec. 3, 2018, now Pat. No. 10,524,337, which is a continuation of application No. 15/146,369, filed on May 4, 2016, now Pat. No. 10,149,370.

(60) Provisional application No. 62/156,680, filed on May 4, 2015.

(51) Int. Cl.
*H05B 47/11* (2020.01)
*H05B 47/16* (2020.01)
(Continued)

(52) U.S. Cl.
CPC .............. *H05B 47/19* (2020.01); *G08C 17/02* (2013.01); *H03K 17/962* (2013.01); *H04W 40/22* (2013.01); *H04W 52/46* (2013.01); *H04W 88/04* (2013.01); *H04W 88/16* (2013.01); *H05B 47/105* (2020.01); *H05B 47/11* (2020.01);
(Continued)

(58) Field of Classification Search
None
See application file for complete search history.

(56) References Cited

U.S. PATENT DOCUMENTS 5,978,364 A   11/1999   Melnik
6,687,487 B1   2/2004   Mosebrook et al.
(Continued)

FOREIGN PATENT DOCUMENTS

CN    1981313 A    6/2007
CN   101283257 A  10/2008
(Continued)

OTHER PUBLICATIONS

Extended European Search Report issued by the European Patent Office for Application No. 17166893.2, dated Oct. 12, 2017, 5 pages.
(Continued)

*Primary Examiner* — Anh Q Tran
(74) *Attorney, Agent, or Firm* — Cooley LLP

(57) ABSTRACT

In some embodiments, a method includes receiving a signal indicating that a timeout timer associated with a space has been has crossed a threshold in a space. If a motion sensor is disposed within the space, the method includes sending a signal to a connector operatively coupled to a light source such that the connector reverts to a default state. If (1) a motion sensor is not disposed within the space and (2) a light sensor is disposed within the space, the method includes sending a signal to the connector such that the connector is controlled by the light sensor.

29 Claims, 22 Drawing Sheets

(51) Int. Cl.

| | | |
|---|---|---|
| *H05B 47/19* | (2020.01) | |
| *H05B 47/105* | (2020.01) | |
| *H04W 88/04* | (2009.01) | |
| *H04W 52/46* | (2009.01) | |
| *H04W 88/16* | (2009.01) | |
| *H04W 40/22* | (2009.01) | |
| *G08C 17/02* | (2006.01) | |
| *H03K 17/96* | (2006.01) | |
| *H02J 7/35* | (2006.01) | |

(52) U.S. Cl.
CPC ............. *H05B 47/16* (2020.01); *H02J 7/35* (2013.01); *H04Q 2209/40* (2013.01); *H04Q 2209/43* (2013.01); *Y02B 20/40* (2013.01)

(56) References Cited

U.S. PATENT DOCUMENTS

| | | |
|---|---|---|
| 7,110,762 B1 | 9/2006 | Cameron et al. |
| 7,729,431 B2 | 6/2010 | Gebara et al. |
| 7,868,482 B2 | 1/2011 | Greene et al. |
| 8,077,035 B2 | 12/2011 | Reid et al. |
| 8,370,093 B1 | 2/2013 | Adams |
| 8,538,596 B2 | 9/2013 | Gu et al. |
| 9,246,573 B1 | 1/2016 | Gettings et al. |
| 9,251,699 B2 | 2/2016 | Greene et al. |
| 9,795,016 B2 | 10/2017 | Motley et al. |
| 10,149,370 B2 | 12/2018 | Greene et al. |
| 10,455,663 B2 | 10/2019 | Greene et al. |
| 10,524,337 B2 | 12/2019 | Greene et al. |
| 10,638,399 B2 | 4/2020 | Greene et al. |
| 2002/0027504 A1 | 3/2002 | Davis et al. |
| 2004/0141502 A1 | 7/2004 | Corson et al. |
| 2005/0003763 A1 | 1/2005 | Lastinger et al. |
| 2005/0102040 A1 | 5/2005 | Kruse et al. |
| 2005/0210340 A1 | 9/2005 | Townsend et al. |
| 2005/0253538 A1 | 11/2005 | Shah et al. |
| 2007/0255116 A1 | 11/2007 | Mehta et al. |
| 2007/0255126 A1 | 11/2007 | Moberg et al. |
| 2007/0255348 A1 | 11/2007 | Holtzclaw |
| 2007/0273307 A1 | 11/2007 | Westrick |
| 2007/0290840 A1 | 12/2007 | Ehrman et al. |
| 2008/0129495 A1 | 6/2008 | Hitt |
| 2008/0129538 A1 | 6/2008 | Vaswani et al. |
| 2008/0220828 A1 | 9/2008 | Jensen |
| 2008/0253327 A1 | 10/2008 | Kohvakka et al. |
| 2008/0264799 A1 | 10/2008 | Sibert |
| 2008/0299896 A1 | 12/2008 | Mohebbi |
| 2009/0088605 A1 | 4/2009 | Ross et al. |
| 2009/0135745 A1 | 5/2009 | Gainey et al. |
| 2009/0231167 A1 | 9/2009 | Chen |
| 2009/0302782 A1 | 12/2009 | Smith |
| 2010/0102926 A1 | 4/2010 | Grieve et al. |
| 2010/0141153 A1 | 6/2010 | Recker et al. |
| 2010/0237711 A1 | 9/2010 | Parsons |
| 2010/0284446 A1 | 11/2010 | Mu et al. |
| 2010/0327766 A1 | 12/2010 | Recker et al. |
| 2011/0004801 A1 | 1/2011 | Duffy et al. |
| 2011/0051703 A1 | 3/2011 | Fulknier |
| 2011/0110281 A1 | 5/2011 | Mehta et al. |
| 2011/0178650 A1 | 7/2011 | Picco |
| 2011/0187275 A1 | 8/2011 | Giltaca et al. |
| 2011/0220182 A1 | 9/2011 | Lin et al. |
| 2011/0260628 A1 | 10/2011 | Dobkin et al. |
| 2011/0317625 A1 | 12/2011 | Urquhart et al. |
| 2012/0062123 A1 | 3/2012 | Jarrell et al. |
| 2012/0092192 A1 | 4/2012 | Wong |
| 2012/0098446 A1 | 4/2012 | Kim et al. |
| 2012/0136485 A1 | 5/2012 | Weber |
| 2012/0147808 A1 | 6/2012 | Rhee |
| 2012/0242454 A1 | 9/2012 | Wyler |
| 2012/0320781 A1 | 12/2012 | Furukawa et al. |
| 2013/0049607 A1 | 2/2013 | Urata |
| 2013/0063027 A1 | 3/2013 | Recker et al. |
| 2013/0073250 A1 | 3/2013 | Acker |
| 2013/0193856 A1 | 8/2013 | Chalmers et al. |
| 2013/0250845 A1 | 9/2013 | Greene et al. |
| 2013/0342131 A1 | 12/2013 | Recker et al. |
| 2014/0167621 A1 | 6/2014 | Trott et al. |
| 2014/0177469 A1 | 6/2014 | Neyhart |
| 2014/0225526 A1 | 8/2014 | Jonsson |
| 2014/0263977 A1 | 9/2014 | Jones |
| 2014/0268628 A1 | 9/2014 | Mann |
| 2014/0297227 A1 | 10/2014 | Barnard |
| 2014/0354161 A1 | 12/2014 | Aggarwal |
| 2015/0015377 A1 | 1/2015 | Bull |
| 2015/0065160 A1 | 3/2015 | Meredith et al. |
| 2015/0076996 A1 | 3/2015 | Flatz |
| 2015/0108901 A1 | 4/2015 | Greene et al. |
| 2015/0292764 A1 | 10/2015 | Land, III et al. |
| 2015/0325112 A1* | 11/2015 | McPherson ............ H04W 4/00 455/419 |
| 2015/0373796 A1 | 12/2015 | Bahrehmand |
| 2016/0192458 A1* | 6/2016 | Keith ................... H05B 47/175 315/291 |
| 2016/0192461 A1* | 6/2016 | Minsky ................. H05B 45/20 315/294 |
| 2016/0198388 A1 | 7/2016 | Greene et al. |
| 2017/0027043 A1 | 1/2017 | Greene et al. |
| 2018/0103411 A1 | 4/2018 | Greene et al. |
| 2019/0254146 A1 | 8/2019 | Greene et al. |
| 2020/0053855 A1 | 2/2020 | Greene et al. |
| 2020/0260356 A1 | 8/2020 | Greene et al. |

FOREIGN PATENT DOCUMENTS

| | | |
|---|---|---|
| CN | 101341521 A | 1/2009 |
| CN | 102217425 A | 10/2011 |
| CN | 102573220 A | 7/2012 |
| DE | 102012205964 A1 | 10/2013 |
| EP | 2 071 777 A1 | 6/2009 |
| JP | S57-179299 U | 11/1982 |
| JP | S62-221205 A | 9/1987 |
| JP | 2005-159670 A | 6/2005 |
| JP | 2005-259437 A | 9/2005 |
| JP | 2005-294456 A | 10/2005 |
| JP | 2006-243979 A | 9/2006 |
| JP | 2007-122433 A | 5/2007 |
| JP | 2009-089379 A | 4/2009 |
| JP | 2009-223724 A | 10/2009 |
| JP | 2010-056613 A | 3/2010 |
| JP | 2010-146923 A | 7/2010 |
| JP | 2011-008971 A | 1/2011 |
| JP | 2011-079461 A | 4/2011 |
| JP | 2011-085393 A | 4/2011 |
| JP | 2011-137782 A | 7/2011 |
| JP | 2011-151630 A | 8/2011 |
| JP | 2012-038188 A | 2/2012 |
| JP | 2012-059580 A | 3/2012 |
| JP | 2012-526442 T | 10/2012 |
| JP | 2012-253047 A | 12/2012 |
| JP | 2013-003911 A | 1/2013 |
| WO | WO 2006/038169 A1 | 4/2006 |
| WO | WO 2010/044293 A1 | 4/2010 |
| WO | WO 2010/086757 A1 | 8/2010 |
| WO | WO 2010/116283 A2 | 10/2010 |
| WO | WO 2010/116283 A3 | 10/2010 |
| WO | WO 2010/128422 A1 | 11/2010 |
| WO | WO2012/022966 | 2/2012 |
| WO | WO 2018/068055 A1 | 4/2018 |

OTHER PUBLICATIONS

International Search Report and Written Opinion issue by the International Searching Authority for Application No. PCT/US2014/061923, dated Feb. 5, 2015, 9 pages.

Extended European Search Report issued by the European Patent Office for Application No. 14856577.3, dated Jun. 28, 2017, 12 pages.

Office Action issued by the Mexican Patent Office for Application No. MX/a/2016/007966, dated Jan. 26, 2018, 4 pages (Non-English).

(56) References Cited

OTHER PUBLICATIONS

Office Action issued by the Mexican Patent Office for Application No. MX/a/2016/007966, dated Jul. 14, 2017, 3 pages (Non-English).
Office Action issued by the Mexican Patent Office for Application No. MX/a/2016/007966, dated Nov. 23, 2016, 2 pages (Non-English).
International Search Report and Written Opinion for International Application No. PCT/US2013/33377, dated May 29, 2013, 8 pages.
Extended European Search Report for European Application No. 13764767.3, dated Oct. 30, 2015, 7 pages.
Japanese Office Action dated Apr. 12, 2016 for JP 2015-501919 (3 page non-English and 4 page English translation).
Chinese Office Action dated Jun. 13, 2016 for CN 201380022436.4, 9 pages.
Non-Final Office Action issued by The United States Patent and Trademark Office for U.S. Appl. No. 15/012,244, dated Jun. 16, 2017, 16 pages.
Japanese Office Action dated Oct. 25, 2019 for JP 2016-234814, (5 page non-English and 6 page English translation).
Non-Final Office Action issued by The United States Patent and Trademark Office for U.S. Appl. No. 13/848,667, dated Feb. 26, 2015, 15 pages.
Non-Final Office Action issued by The United States Patent and Trademark Office for U.S. Appl. No. 14/521,884, dated May 19, 2017, 21 pages.
Office Action issued by The United States Patent and Trademark Office for U.S. Appl. No. 14/521,884, dated Sep. 2, 2016, 14 pages.
Office Action issued by The United States Patent and Trademark Office for U.S. Appl. No. 14/521,884, dated Jan. 25, 2016, 13 pages.
Office Action issued by The United States Patent and Trademark Office for U.S. Appl. No. 14/521,884, dated May 6, 2015, 18 pages.
Extended European Search Report issued by the European Patent Office for Application No. 16789997.0, dated Feb. 21, 2019, 12 pages.
International Search Report and Written Opinion issue by the International Searching Authority for Application No. PCT/US2016/030729, dated Aug. 12, 2016, 7 pages.
Office Action issued by The United States Patent and Trademark Office for U.S. Appl. No. 15/146,369, dated Mar. 17, 2017, 19 pages.
Final Office Action issued by The United States Patent and Trademark Office for U.S. Appl. No. 15/146,369, dated Dec. 8, 2017, 21 pages.
Examination Report issued by the Australian Patent Office for Application No. 2016210603, dated May 2, 2017, 3 pages.
Examination Report issued by the Australian Patent Office for Application No. 2013235059, dated Dec. 18, 2015, 3 pages.
Notice of Reasons for Rejection issued by the Japanese Patent Office for Application No. 2016-234814, dated Nov. 24, 2017, 5 page non-English and 6 page English language.
Examination Report issued by the Australian Patent Office for Application No. 2017258941, dated Dec. 24, 2018, 3 pages.
Office Action issued by the European Patent Office for Application No. 16789997.0, dated Dec. 12, 2017, 3 pages.
Office Action issued by the Chinese Patent Office for Application No. 201480065234.2, dated Nov. 24, 2017 (12 pages Non-English and 18 page English translation).
International Search Report and Written Opinion issued by the International Searching Authority for Application No. PCT/US2017/055982, dated Dec. 29, 2017, 12 pages.
Final Office Action issued by The United States Patent and Trademark Office for U.S. Appl. No. 14/521,884, dated Mar. 8, 2018, 25 pages.
Office Action issued by the European Patent Office for Application No. 14856577.3, dated Apr. 26, 2018, 6 pages.
Office Action issued by the European Patent Office for Application No. 14856577.3, dated Mar. 3, 2020, 8 pages.

Office Action issued by the European Patent Office for Application No. 14856577.3, dated Apr. 16, 2019, 7 pages.
Examination Report No. 1 issued by the Australian Patent Office for Application No. 2014340037, dated May 15, 2018, 3 pages.
Examination Report No. 2 issued by the Australian Patent Office for Application No. 2014340037, dated Apr. 9, 2019, 3 pages.
Final Office Action issued by The United States Patent and Trademark Office for U.S. Appl. No. 15/012,244, dated Apr. 16, 2018, 17 pages.
Office Action issued by the Mexican Patent Office for Application No. MX/a/2016/005249, dated May 24, 2018, 4 pages (Non-English).
Office Action issued by the Mexican Patent Office for Application No. MX/a/2016/005249, dated Jan. 24, 2019, 4 pages (Non-English).
Office Action issued by the Japanese Patent Office for Application No. 2016-523953 dated Jul. 11, 2018, and received on Jul. 19, 2018, (6 page non-English and 7 page English translation).
Advisory Action issued by The United States Patent and Trademark Office for U.S. Appl. No. 14/521,884, dated Jul. 31, 2018, 8 pages.
Office Action issued by The United States Patent and Trademark Office for U.S. Appl. No. 14/521,884, dated Sep. 26, 2018, 21 pages.
Office Action issued by the Chinese Patent Office for Application No. 201480065234.2, dated Aug. 2, 2018, (3 pages Non-English).
Office Action issued by the Mexican Patent Office for Application No. MX/a/2016/007966, dated Aug. 17, 2018, 8 pages (Non-English).
Non-Final Office Action issued by The United States Patent and Trademark Office for U.S. Appl. No. 15/012,244, dated Nov. 30, 2018, 25 pages.
Non-Final Office Action issued by The United States Patent and Trademark Office for U.S. Appl. No. 15/729,567, dated Dec. 11, 2018, 22 pages.
Office Action issued by the Canadian Patent Office for Application No. 2,867,856 dated Nov. 30, 2018, 3 pages.
Office Action issued by the Japanese Patent Office for Application No. 2016-234814 dated Nov. 2, 2018, 6 pages.
Non-Final Office Action issued by The United States Patent and Trademark Office for U.S. Appl. No. 15/729,567, dated Sep. 5, 2019, 17 pages.
Final Office Action issued by The United States Patent and Trademark Office for U.S. Appl. No. 15/012,244, dated Sep. 9, 2019, 10 pages.
Examination Report issued by the Canadian Patent Office for Application No. 2,867,856 dated Dec. 9, 2019, 8 pages.
Office Action issued by the Chinese Patent Office for Application No. 201710871680.8, dated Nov. 19, 2019 (7 pages Non-English and 6 page English translation).
Office Action issued by the European Patent Office for Application No. 16789997.0, dated Jan. 2, 2020, 7 pages.
Extended European Search Report issued by the European Patent Office for Application No. 17859324.0, dated Mar. 30, 2020, 8 pages.
Examination Report No. 1 issued by the Australian Patent Office for Application No. 2019216715, dated Jun. 27, 2020, 3 pages.
Office Action issued by the Chinese Patent Office for Application No. 201680032959.0, dated Jul. 29, 2020 (6 page Non-English and 6 page English translation).
Office Action issued by the Chinese Patent Office for Application No. 201710871680.8, dated Aug. 3, 2020 (3 page Non-English and 4 page English translation).
Japanese Office Action dated Aug. 31, 2020, for JP 2019-118866, (6 page non-English and 7 page English translation).
Office Action issued by the European Patent Office for Application No. 17166893.2, dated Sep. 11, 2020, 3 pages.
Office Action issued by the Chinese Patent Office for Application No. 201910418570.5, dated Sep. 28, 2020 (9 pages Non-English only).
Examination Report issued by the Canadian Patent Office for Application No. 2,867,856 dated Oct. 13, 2020, 4 pages.

* cited by examiner

AUTOMATED SYSTEM FOR LIGHTING CONTROL

CROSS-REFERENCE TO RELATED APPLICATIONS

This application is a continuation of U.S. patent Ser. No. 16/208,382, now U.S. Pat. No. 10,524,337, entitled "Automated System for Lighting Control," filed Dec. 3, 2018, which is a continuation of U.S. application Ser. No. 15/146,369, now U.S. Pat. No. 10,149,370, entitled "Automated System for Lighting Control," filed May 4, 2016, which claims priority to U.S. Provisional Application No. 62/156,680, entitled "Automated System for Lighting Control," filed May 4, 2015; the disclosure of each of which is incorporated by reference herein in its entirety.

This application is related to U.S. patent application Ser. No. 14/521,884, entitled "Automated System for Lighting Control," filed Oct. 23, 2014, which claims priority to U.S. Provisional Patent Application Ser. No. 61/894,899 entitled, "Automated System for Lighting Control," filed Oct. 23, 2013; the disclosure of each of which is incorporated by reference herein in its entirety.

This application is related to U.S. patent application Ser. No. 13/848,667, entitled "Wireless Sensor System, Method and Apparatus with Switch and Outlet Control," filed Mar. 21, 2013, which claims priority to U.S. Provisional Application No. 61/613,753, entitled "Wireless Sensor System with Switch and Outlet Control," filed Mar. 21, 2012; the disclosure of each of which is incorporated by reference herein in its entirety.

BACKGROUND

Some embodiments described herein relate generally to wireless sensor systems, methods and apparatus with switch and outlet control.

Known systems exist for remotely controlling power to switches and outlets. Such system, however, may use long cabling runs to control an individual switch or outlet. Other known system may frequently use battery power, causing rapid depletion of onboard batteries and/or may use additional cabling to provide power to local switch and outlet controllers.

Thus, a need exists for a wireless sensor systems, methods and apparatus with switch and outlet control.

SUMMARY

In some embodiments, an apparatus includes a wireless sensor configured to be operatively coupled to a network gateway device that is configured to receive one of a first data packet or a second packet from the wireless sensor. The wireless sensor is configured to send the first data packet at a first time on a first frequency, the first data packet including a payload associated with a value of a measurement that was measured by the wireless sensor. The wireless sensor is configured to send the second data packet at a second time on a second frequency, the second data packet includes a payload associated with the value.

DETAILED DESCRIPTION

Figure 1:
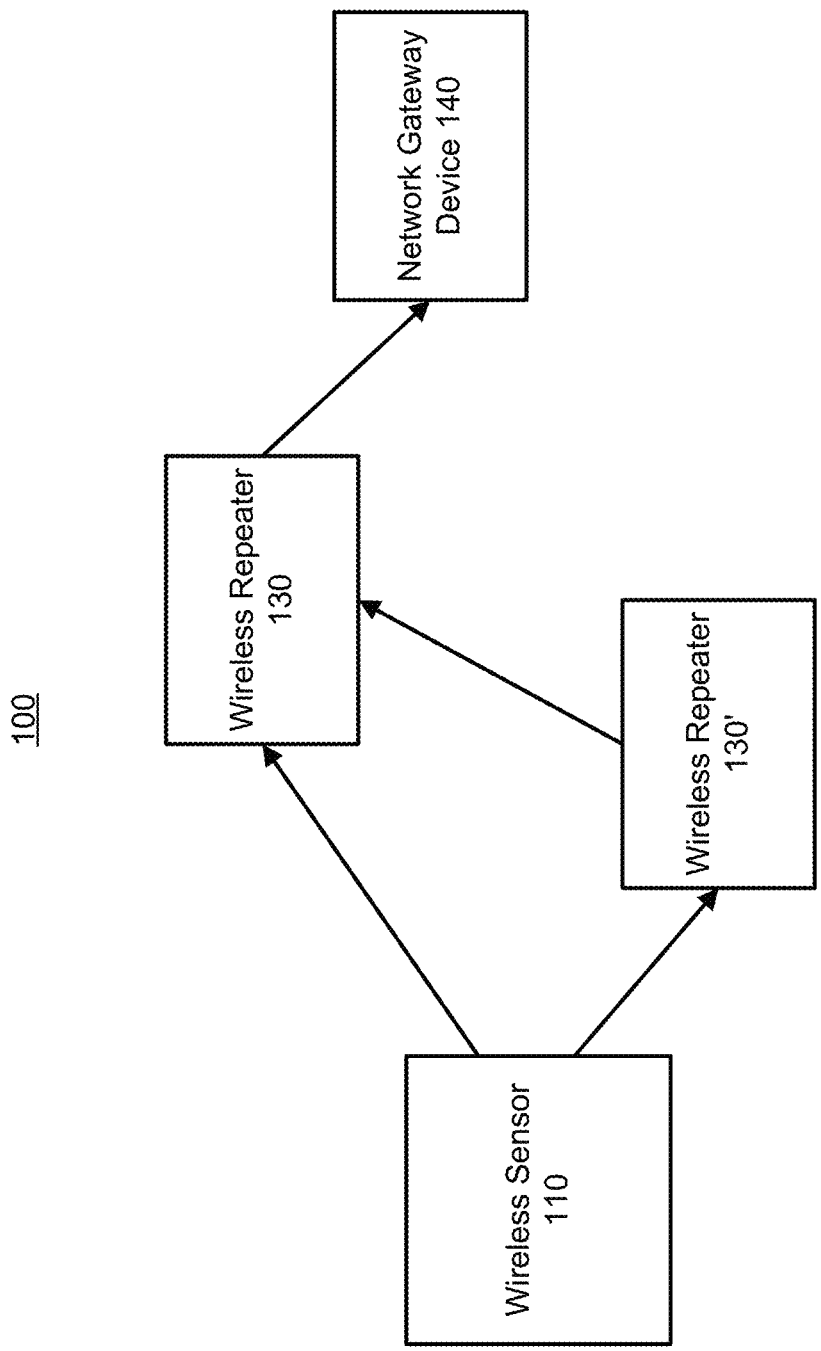
FIG. 1 is a schematic illustration of a wireless sensor system according to an embodiment.

In some embodiments, a method includes receiving a signal indicating that a timeout timer associated with a space has crossed a threshold. If a motion sensor is disposed within the space, the method includes sending a signal to a wireless controller operatively coupled to a light source such that the wireless controller reverts to a default state. If (1) a motion sensor is not disposed within the space and (2) a light sensor is disposed within the space, the method includes sending a signal to the wireless controller such that the wireless controller is controlled by the light sensor.

In some embodiments, the method includes receiving a signal from the light sensor indicating that a lux level of the space is below a predetermined level, and sending a signal to the wireless controller to causes the light in the space to brighten. In some embodiments, the method includes receiving a signal from the light sensor indicating that a lux level of the space is above a predetermined level and sending a signal to the wireless controller such that the wireless controller causes a light in the space to dim. In some embodiments, if a motion sensor is disposed within the space, the method includes resetting, in response to an indication from the motion sensor that the space is occupied, the timeout timer. In some embodiments, the timeout timer is set for thirty minutes. In some embodiments, if the (1) the motion sensor is not disposed within the space and (2) a light sensor is not disposed within the space, the method includes sending, in response to an indication that the space is not scheduled to be occupied, a signal to the wireless controller such that the wireless controller reverts to the default state. In some such embodiments, the default state is OFF.

In some embodiments, an apparatus includes a network gateway device. The network gateway device is configured to be wirelessly coupled to (1) a wireless switch, (2) a light sensor disposed in a space, and (3) a wireless controller coupled to a light that is configured provide a lux level to the space. The network gateway device configured to receive, from the light sensor, an indication of an ambient light level of the space. The network gateway device is configured to receive, from the wireless switch, a signal indicative of a request for the light to be turned on. The network gateway device is configured to send, to the wireless controller, a command configured to cause the light to increase in brightness an amount based on the ambient light of the space.

In some embodiments, the network gateway device is configured to receive a signal indicating that a timeout timer has crossed a threshold, and, if a motion sensor is disposed within the space, the network gateway device is configured to send a signal to the wireless controller such that the wireless controller reverts to a default state. In some such embodiments, the default state is ON. In some embodiments, the network gateway device is configured to receive a data packet including an identification of a motion sensor disposed within the space and the network gateway device is configured to associate the motion sensor with the wireless controller. In some embodiments, the network gateway device is configured to receive, from the light sensor, an indication of the lux level of the space and the network gateway device is configured to send signal to the wireless controller such that a brightness level of the light changes to maintain the lux level of the space within a predetermined range. In some such embodiments, the predetermined range is between 350 and 450. In some embodiments, the network gateway device is wirelessly coupled to the wireless controller via two channels simultaneously.

In some embodiments, an apparatus includes a wireless controller configured to be operatively coupled to a light that is configured to selectively provide a lux level to a space. The wireless controller is configured to be wirelessly coupled to (1) a network gateway device that is wirelessly coupled to a light sensor and (2) a wireless switch. The wireless controller is configured to receive, from the network gateway device in response to the network gateway device receiving a request from the wireless switch, an instruction to increase a brightness of the light an amount based on a data from the light sensor indicative of the lux level of the space. The wireless controller is configured to send a signal to the light such that the brightness of the light is increased.

In some embodiments, the wireless controller is configured to be line-powered and the wireless switch is configured to be battery-powered. In some embodiments, the wireless controller is configured to wirelessly couple the light sensor to the network gateway device by repeating all packets received from the light sensor to the network gateway device. In some embodiments, the wireless controller is configured to receive an indication of a lost connection with the network gateway device and the wireless controller is configured to, in response to the lost connection, default to an ON state. In some embodiments, the wireless controller is configured to receive, from the network gateway device, a signal to revert to a default state in response to the network gateway device receiving (1) a signal indicating that a timeout timer crossed a threshold and (2) an indication from a motion sensor that the space in unoccupied.

In some embodiments, a method includes receiving a signal indicating that a timeout timer associated with a space has crossed a threshold. If a motion sensor is disposed within the space, the method includes sending a signal to a wireless controller operatively coupled to a light source within the space such that the wireless controller reverts to a default state. If (1) a motion sensor is not disposed within the space and (2) an indication is received that the space is not scheduled to be occupied, the method includes sending a signal to the wireless controller such that the wireless controller reverts to the default state.

In some embodiments, if (1) the motion sensor is not disposed within the space and (2) an indication is received that the space is scheduled to be occupied, the method includes allowing the wireless controller to continue in a present state. In some embodiments, the method includes receiving, from a battery-powered capacitive touch switch, a signal indicative of a request to increase a brightness of the light source. In some embodiments, the method includes receiving, from a battery-powered capacitive touch switch, a signal indicative of a request to reduce a brightness of the light source. In some embodiments, the method includes receiving, from a battery-powered capacitive touch switch, a signal indicative of a request to turn off the light source.

A wireless sensor system can be used to measure and monitor environmental characteristics of, for example, a room of a building, characteristics of a wireless sensor itself, for example, whether a plug is in use, and/or to effect a characteristic of a room or the wireless sensor. By way of example, a wireless sensor can include a light or outlet switch configured to sense and/or control whether an electrical switch controlling a light or outlet is opened or closed. In another example, a wireless sensor can include carbon monoxide sensor configured to measure a level of carbon monoxide in an area. In some embodiments, aspects of a wireless sensor system can be retrofitted into an existing system without the need to make additional changes to the existing system. For example, a light switch type wireless sensor described herein can replace an existing light switch without the need to add additional wiring, replace junction boxes, etc.

As used in this specification, the singular forms "a," "an" and "the" include plural referents unless the context clearly dictates otherwise. Thus, for example, the term "a data packet" is intended to mean a data packet or a combination of data packets.

FIG. 1 is a schematic illustration of a wireless sensor system ("system") 100 according to an embodiment, system 100 includes a wireless sensor 110. In some embodiments, at least a portion of the wireless sensor 110 may be disposed within an electrical enclosure (not shown). System 100 includes a wireless repeater 130, a wireless repeater 130', and a network gateway device 140.

System 100 includes a wireless sensor 110 that is configured to measure a characteristic of wireless sensor 110 and/or of a room with which wireless sensor 110 is located. In some embodiments, wireless sensor 110 can include an environmental sensor, for example, to measure a temperature, pressure, carbon gas levels, humidity etc. In some embodiments, wireless sensor 110 can include an area sensor, for example, to measure motion, light level, proximity, touch, etc. In some embodiments, wireless sensor 110 can include an electrical sensor, for example, to measure and/or control an energy usage, switch state, outlet state, etc. In some embodiments, at least a portion of wireless sensor 110 can be disposed within the electrical enclosure. In some embodiments, an electrical enclosure can be a standard electrical junction box, for example, a metal and/or plastic box that is configured to be disposed in and/or on a wall and/or other support, and that is configured to house one or more electrical connections and/or associated components, for example, switches, outlets, etc. In some embodiments, the electrical enclosure can generally be any enclosure normally used to house AC or DC wiring electrical connections, such as grounded enclosures (e.g. light fixtures, breaker boxes, distribution panels, etc.). In some embodiments, wireless sensor 110 can include a sensor module (not shown in FIG. 1), processor module (not shown in FIG. 1), a first radio module (not shown in FIG. 1), a second radio module (not shown in FIG. 1), a first antenna (not shown in FIG. 1), a second antenna (not shown in FIG. 1). In some embodiments, wireless sensor 110 can include a battery (not shown), a switch (not shown), an analog-to-digital converter (not shown), ports (not shown), interfaces (not shown), etc. In some embodiments, wireless sensor 110 can operate as a wireless repeater, for example, similar to wireless repeater 130 described below, for other wireless sensors.

Wireless sensor 110 can include the sensor module to measure a value of a characteristic of wireless sensor 110 and/or an environment within which wireless sensor 110 is located. For example, the sensor module can measure an environmental value (temperature, pressure, motion etc), a motion and/or occupancy value, and/or a characteristic and/or state of an electrical component associated with wireless sensor 110 (open or closed light switch, electrical outlet plugged in or in use, etc). In some embodiments, the sensor module can be included in the processor module. The sensor module can measure the value at a predetermined time and/or on a predetermined schedule, in response to an event, etc. The sensor module can provide the value of a measurement to the processor module. In some embodiments, sensor module 110 can include a clock module (not shown) to prompt a measurement based on the predetermined time and/or schedule. In such embodiments, the clock module can include a "loose tolerance" of between about 5-10%. In such an embodiment, the clock module can include an RC based oscillator to implement the loose tolerance. In such embodiments, the RC based oscillator can be included in the processor module. In this manner, a system 100 that includes more than one wireless sensor 110 that each includes a clock module having substantially the same setting can, via radio/ antenna sets, send signals at different times to reduce communication collisions. In some such embodiments, the clock can determine when a measurement is taken and/or when a data packet including the value of the measurement is sent. The predetermined time for measuring a value and/or transmitting an associated packet can be programmed, user adjustable via an input device, event driven, randomly derived, or set by network gateway device 140.

Wireless sensor 110 can include a processor module to define at least one data packet including values associated with measurements of the sensor module. The sensor module can define one or more copies of the one or more data packets. A data packet can include sensor data (e.g. value of measurement taken by the sensor module), control data (e.g. a switch has been opened or closed), control requests (e.g. should a switch be opened or closed), network identification information (e.g. node identification number, network identification number), security information (e.g. data encryption key), etc. The processor module can include a computer processor or microprocessor and/or memory, for example a random access memory (RAM), a memory buffer, a hard drive, a database, an erasable programmable read-only memory (EPROM), an electrically erasable read-only memory (EEPROM), and/or so forth. Memory can be used to hold data such as, but not limited to, schedules, set points, instructions, etc. for use to control or communicate data to wireless sensor 110, repeaters 130, 131', or network gateway device 140. In this manner, the processor module stores and sends the at least one data packet and the one or more copies of the at least one data packet to the first radio and/or to the second radio at different times. In this manner, wireless sensor 110 can send a data packet, which may include the value of the measurement, control data, control requests etc, at more than one time and from more than one antenna.

Wireless sensor 110 can include one or more transmitter sets, for example a first transmitter set (e.g., the first radio and the associated first antenna), and a second transmitter set (e.g., the second radio and associated second antenna), to transmit data packets including a value of a measurement, control data, control requests etc from wireless sensor 110 to, for example, wireless repeaters 130, 130'. A transmitter set can transmit a data packet using any modulation type, for example Direct Sequence Spread Spectrum (DSSS) or Frequency Hopping Spread Spectrum (FHSS). In some embodiments, a hybrid DSSS and FSSS system, frequency hopping direct sequence spread spectrum (FHDSSS), can be used spreading data packets across both frequency and time to reduce the probability of interference from other transmitter sets (e.g., within wireless sensor 110, another wireless sensor, or another device including a transmitter set). In a hybrid system, the data packet can be transmitted using a DSSS signal that can be hopped from channel to channel to increase robustness. In some embodiments, the first antenna and/or the second antenna can be a dipole (e.g., omnidirectional) antenna or can be a patch (e.g., directional) antenna.

In some embodiments, each transmitter set of wireless sensor 110 can operate on a different channel substantially simultaneously. In some embodiments, a transmitter set of wireless sensor 110 can operate on two or more different channel sequentially. In this manner, wireless sensor 110 may not need to verify that other components of system 100 are operating on a particular channel. In other words, by sending a copy of a data packet on multiple channels of system 100, the other components of system 100 should receive at least one of the data packet and/or the copies of the data packet. In some such embodiments, and as discussed below, other components of system 100 can include multiple transmitter sets, such that those components can receive at least one of the data packet and/or copies of the data packet. In such embodiments, an amount of energy used to send a data packet and/or copies of a data packet at multiple times and/or on multiple channels can be lower than the energy used to verify a component is operating on a particular channel. In such embodiments, a first channel and a second channel can be substantially opposite ends of the frequency band to maximize the probability that any source of potential interference is avoided by the other channel. As an example wireless sensor 110 can transmit, substantially simultaneously or sequentially, on a first channel at 903 MHz and on a second channel at 927 MHz in the 902-928 MHz band.

In some embodiments, and as described above, wireless sensor 110 can send a data packet and/or copies of the data packet on two or more channels and at two or more times. In such embodiments, wireless sensor 110 can be in a sleep mode (or other low power or zero power mode of operation) for a portion of the time to conserve the power of a power supply (e.g., battery). At the predetermined interval and/or schedule, wireless sensor 110 can awake from the sleep mode and can be in an active mode. Wireless sensor 110 can measure a value of a characteristic and define a data packet including the value. Wireless sensor 110 can define a data packet including control data or control requests. In such embodiments, as discussed above, wireless sensor 110 can send a data packet via a first transmitter set at a first time, and then send a first copy of the data packet from the first transmitter set at a second time, after the first time. In such embodiments, wireless sensor 110 can send a second copy of the data packet via a second transmitter set at a third time, and then send a third copy of the data packet from the second transmitter set at a fourth time, after the third time.

In some embodiments, wireless sensor 110 can receive data for setup of system 100, including a network ID, security features, and a wireless sensor identification numbers. In some embodiments, after the setup of system 100, wireless sensor 110 can be designated as a transmit-only wireless sensor. In some embodiments, wireless sensor 110 can periodically send a status request data packet to network gateway device 140, via wireless repeater 130 and wireless repeater 130' if necessary, and can be designated as a transmit/receive device to receive commends.

System 100 includes wireless repeater 130 configured to receive data packets from wireless sensor 110 and/or wireless repeater 130', and to send data packets to network gateway device 140. System 100 includes wireless repeater 130', similar to wireless repeater 130, and configured to receive data packets from wireless sensor 110 and to send data packets to wireless repeater 130. Wireless repeaters 130,130' can include a computer/micro processor or microprocessor and/or memory, for example a random access memory (RAM), a memory buffer, a hard drive, a database, an erasable programmable read-only memory (EPROM), an electrically erasable read-only memory (EEPROM), and/or so forth. Memory may be used to hold data such as, but not limited to, schedules, set points, instructions, etc. for use to control or communicate data to wireless sensor 110, repeaters 130, 131', or network gateway device 140. In this manner, wireless repeaters 130, 130' can store received data packets for a predetermined period of time in a buffer. In some embodiments, the buffer of a wireless repeater can store a received data packet and can compare the data packet to other data packets in the buffer and/or data packets that have been recently received and/or forwarded. In such embodiments, the wireless repeater can discard duplicate data packets. By way of example, wireless repeater 130 can receive a first data packet from wireless sensor 110, and can receive a second data packet, identical to the first data packet, from wireless sensor 110 via wireless repeater 130'. In such embodiments, wireless repeater 130 can discard either the first data packet or the second data packet, for example, based on which was received first (e.g., first in first out, "FIFO"), which has a stronger received signal strength, and/or another metric. In some embodiments, wireless repeater 130 can discard packets after a period of time, for example 5 seconds.

Wireless repeaters 130,130' can include at least one transmitter set to receive and/or send signals, including data packets. In some embodiments, wireless repeaters 130,130' can include at least the same number of transmitter sets as wireless sensor 110. In this manner, wireless repeaters 130,130' can send and receive any data packet sent from wireless sensor 110. By way of example, wireless sensor 110 can include a first transmitter set sending data packets on a first channel and at a first time and a second time, and can include a second transmitter set sending data packets on a second channel and at a third time and a fourth time. In such an example, wireless repeaters 130,130' can include a first transmitter set operating on the first channel and a second transmitter set operating on the second channel such that either of wireless repeaters 130,130' can receive four copies of a data packet. By way of example, wireless sensor 110 can include a first transmitter set sending data packets on a first channel at a first time and second channel at a second time. In such an example, wireless repeaters 130,130' can each include a first transmitter set operating on the first channel and a second transmitter set operating on the second channel such that either of wireless repeaters 130,130' can receive two copies of a data packet without a need to switch between the channels. In such an example, the system 100 can include multiple frequencies, multiple times, multiple data paths, and multiple antennas, i.e. the system 100 has frequency diversity, time diversity, spatial diversity, and antenna diversity. Said another way, the system 100 has concurrent frequency, time, spatial, and antenna diversity. By way of another example, wireless repeaters 130,130' can each include a first transmitter set sending or receiving data packets on a first channel at a first time and a second transmitter set sending or receiving data packets on a second channel at a second time. In such an example, the first time and the second time may overlap.

In some embodiments, wireless repeaters 130,130' can calculate a received signal strength indication (RSSI) upon receipt of a data packet. In such embodiments, wireless repeaters 130,130' can add this data to the data packet, for example, at the end of a data packet payload. In this manner, network gateway device 140 can examine the RSSI data for each hop between wireless sensor 110 and network gateway device 140. In some such embodiments, network gateway device 140 can use the added data to determine a number of hops between wireless sensor 110 and network gateway device 140. In such embodiments, network gateway device 140 can compare the number of hops actually used to an expected number of hops, for example, to determine an efficiency and/or health of system 100.

System 100 includes network gateway device 140 configured to receive data packets from wireless repeater 130, 130' or directly from wireless sensor 110. Network gateway device 140 can receive data packets using a wireless protocol, for example, with one or more transmitter sets, and can convert the data packets to a wired protocol for further transmission via a wired network (not shown) coupled to the network gateway device 140. By way of example, network gateway device 140 can transform data packets received in a wireless format, for example 802.15.4, WiFi, cellular (GSM, CDMA, etc.), or satellite, and convert them into a different wireless protocol and/or a wired protocol such as 1) Ethernet: BACnet/IP, BACnet/Ethernet, Modbus TCP, Ethenet/IP, Omron FINS, DNP3, SNMP, XML 2) RS-485: BACnet/MSTP, Metasys N2, Modbus RTU, JBus, DNP, YorkTalk, Allen Bradley DF1, and 3) FTT-10: LonWorks. In some embodiments, network gateway device 140 can convert the data packets to a wireless protocol for further transmission via a wireless network (not shown) such as for example 802.15.4, WiFi, cellular (GSM, CDMA, etc.), or satellite wireless networks. In such embodiments, network gateway device or wireless repeaters can have one or more input/outputs, each input/output configured to operate using a different protocol. By way of example, with respect to a building, network gateway device 140 can include a first input/output operating using the BACnet/IP protocol for communication with a building heating, ventilation, and air conditioning system, can include a second input/output operating using the TCP/IP protocol for communication via a network, such as the internet, for viewing on a browser based page, and can include a third input/output operating using a serial bus connection (e.g., universal serial bus) for local (e.g., at network gateway device 140) communication, configuration, etc. The input/outputs can be used, for example, for monitoring, graphing, alarming (via email, text message, or other method), setup of the wireless network, etc.

Similar to wireless repeaters 130,130' described above, in some embodiments, network gateway device 140 can include the same number of transmitter sets as wireless sensor 110 and/or wireless repeaters 130,130'. In this manner, network gateway device 140 can send and/or receive any data packet sent from wireless sensor 110 and/or from wireless repeaters 130,130'. Similar to wireless repeaters 130,130' and wireless sensor 110, network gateway device 140 can include a computer/micro processor and/or memory, for example a random access memory (RAM), a memory buffer, a hard drive, a database, an erasable programmable read-only memory (EPROM), an electrically erasable read-only memory (EEPROM), and/or so forth. Memory can be used to hold data such as, but not limited to, schedules, set points, instructions, etc. for use to control or communicate data to wireless sensor 110, repeaters 130, 131', or network gateway device 140. In this manner, the network gateway device 140 can store and send data packets, for example prior to and/or after conversion from a first protocol to a second protocol, as described above, or in response to data received from the one or more input/outputs.

In some embodiments, network gateway device 140 can coordinate the frequency of the channel (or channels for multiple transmission set embodiments) at which wireless sensor 110 and wireless repeaters 130,130' operate. In such embodiments, network gateway device can transmit a periodic instruction to switch channel(s) and/or network ID. In such an embodiment, network gateway device 140 can send such an instruction, for example, every ten seconds. In some embodiments, whether an instruction is sent, for example to change channel(s), and what the instruction includes, can be based on the health of the network, for example the number of hops a data packet takes, the RSSI of data packet transmissions, etc. In some embodiments, network gateway device 140 can coordinate the security of the wireless system 100 by transferring security data, wirelessly or via a wired connection, such as a security key, to the wireless sensor 110 and wireless repeaters 130,130'.

Figure 2:
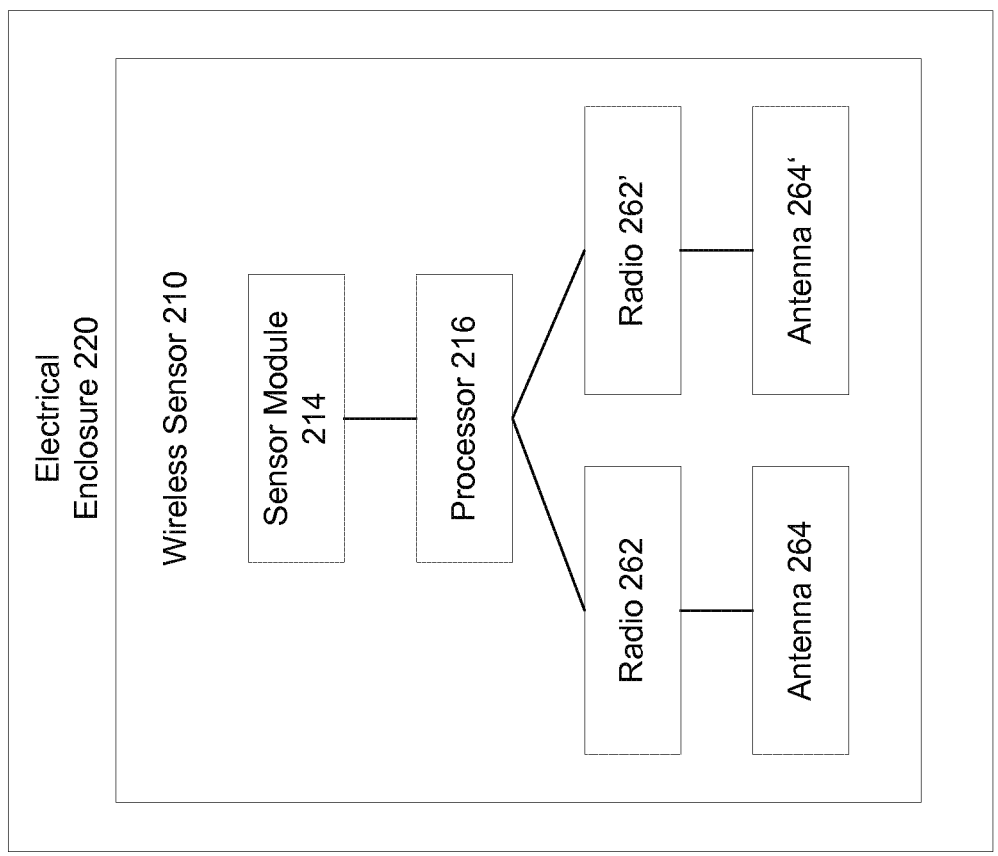
FIG. 2 is a schematic illustration of a wireless sensor and junction box according to an embodiment.

FIG. 2 is a schematic illustration of a wireless sensor 210 at least partially disposed within an electrical enclosure 220. Wireless sensor 210 can be similar to and can include similar components to wireless sensor described above. For example, wireless sensor 210 can include a processor 216 that can be similar to the processor described above with respect to wireless sensor 110. Wireless sensor 210 includes a sensor module 214, the processor 216, a radio 262, a radio 262', an antenna 264, and an antenna 264'. In some embodiments, radio 262, 262' can include more than one antenna, for example, radio 262 includes antenna 264 and can include a second antenna (not shown). In such an embodiment, wireless sensor 210 can select whichever of antenna 264 or the second antenna has a stronger RSSI for use by radio 262.

Figure 3:
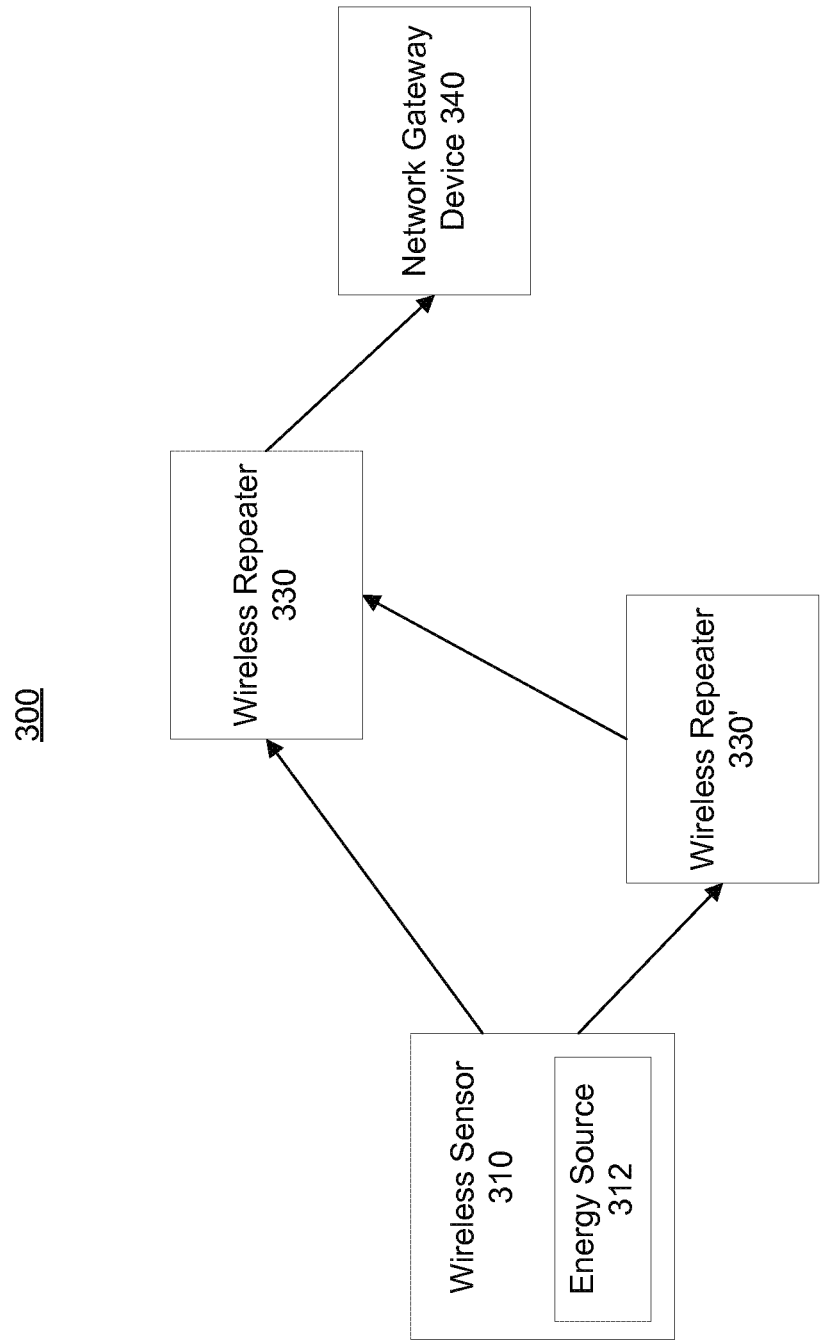
FIG. 3 is a schematic illustration of a wireless sensor system according to an embodiment.

FIG. 3 is a schematic illustration of a wireless sensor system ("system") 300 according to an embodiment, system 300 can be similar to system 100 and can include similar components. For example, system 300 includes a wireless sensor 310 that is similar to wireless sensor 110 and at least a portion of which can be disposed within an electrical enclosure (not shown). System 300 includes a wireless repeater 330, a wireless repeater 330', and a network gateway device 340. Unlike wireless sensor 110 as shown in FIG. 1, wireless sensor 310 includes an energy source 312 configured to supply wireless sensor 310 with energy independent of an energy supply (not shown) of the electrical enclosure 320. In some embodiments, energy source 312 can include a battery, for example battery using stable battery chemistry, such as Lithium Thionyl Chloride or Lithium Iron Disulfide, that can chemically last up to and beyond 25 years. In some embodiments, energy source 312 can include an energy harvester, alone or in combination with a battery. In some embodiments, an energy harvesting device can be, for example, similar to an energy harvesting device described in U.S. Pat. No. 7,868,482, entitled "METHOD AND APPARATUS FOR HIGH EFFICIENCY RECTIFICATION FOR VARIOUS LOADS," which is incorporated by reference herein.

Figure 4:
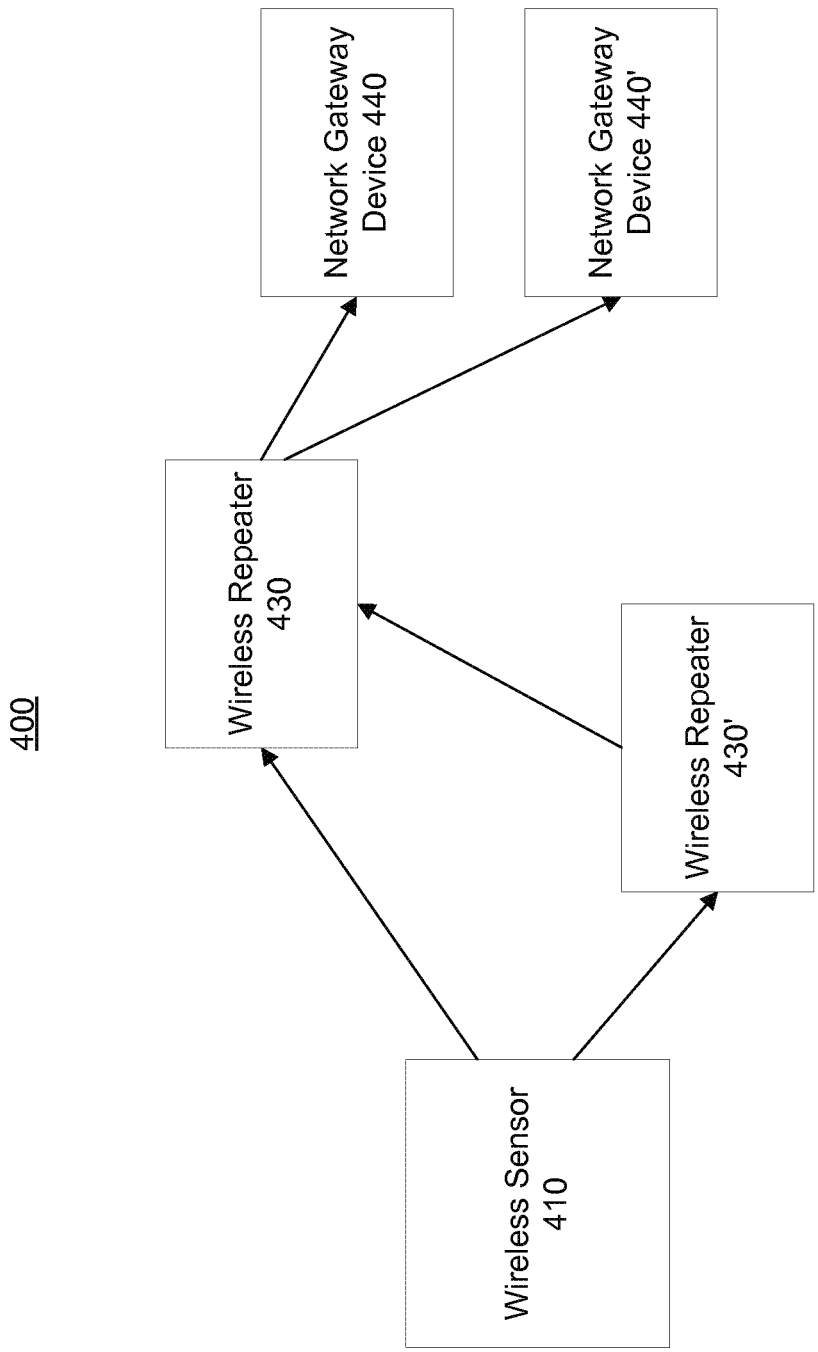
FIG. 4 is a schematic illustration of a wireless sensor system according to an embodiment.

FIG. 4 is a schematic illustration of a wireless sensor system ("system") 400 according to an embodiment. System 400 can be similar to system 100 and can include similar components. For example, system 400 includes a wireless sensor 410 that is similar to wireless sensor 110 and at least a portion of which can be disposed within an electrical enclosure (not shown). System 400 includes a wireless repeater 430, a wireless repeater 430', and a network gateway device 440. Unlike system 100 as shown in FIG. 1, system 400 includes a network gateway device 440'. In such embodiments, network gateway devices 440, 441' can be configured to receive data packets from wireless sensor 410 and wireless repeaters 430,430'. In this manner, if one of network gateway devices 440, 440' should fail, the other of network gateway devices 440, 440' can continue to operate. In some embodiments network gateway device 440 can be associated with a first wired network and network gateway device 440' can be associated with a second wired network, at least a portion of which can be different from the first wired network. In some embodiments, network gateway device 440 can be in communication with a portion of a set of wireless repeaters and/or wireless sensors (not shown in its entirety) of system 400, and network gateway device 440' can be in communication with a different portion of the set of wireless repeaters and/or wireless sensors of system 400. In such embodiments, either of wireless repeaters 430,430' can be included in the portion of the plurality of wireless repeaters and/or in the different portion of the set of wireless repeaters.

In some embodiments, it may be necessary to install a new network gateway device (not shown) or a second network gateway device (not shown) within the wireless sensor system. This can be performed using a listen mode initiated by a button press on the network gateway device 440,440' or by using a computer interface on the network gateway device 440,440' and graphical user interface. As an example, the wireless sensor 410 can be connected to the network gateway device 440,440' by connecting a mini-USB cable between the wireless sensor 410 and the network gateway device 440,440'. At this time, the network gateway device 440,440' will instruct the wireless sensor 410 via the cable to set the appropriate channel and network ID and assign the wireless sensor 410 a unique wireless sensor ID. If a network gateway device 440,440' ceases to operate, a new network gateway device 440,440' can be deployed by enabling listen mode to listen to the network for a predetermined period of time and store the IDs of all wireless sensors 410 and map the wireless sensor 410 data to the appropriate memory location.

Figure 5:
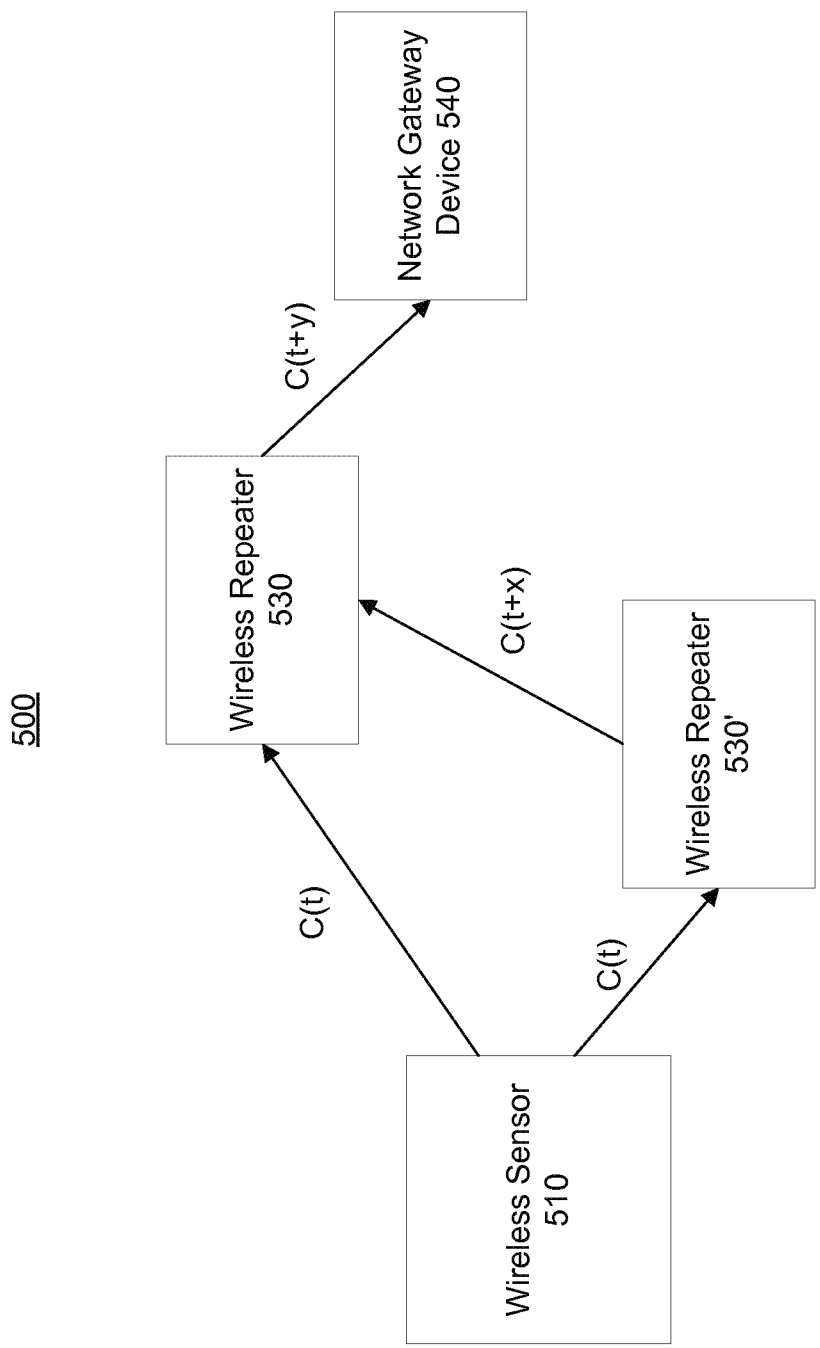
FIG. 5 is a schematic illustration of a wireless sensor system according to an embodiment.

FIG. 5 is a schematic illustration of a wireless sensor system ("system") 500 according to an embodiment. System 500 can be similar to system 100 and can include similar components. For example, system 500 includes a wireless sensor 510 that is similar to wireless sensor 110 and at least a portion of which can be disposed within an electrical enclosure (not shown). System 500 includes a wireless repeater 530, a wireless repeater 530', and a network gateway device 540. As shown in FIG. 5, wireless sensor 510 can send a data packet C at a time t, shown as C(t). Wireless repeater 530 can receive the data packet C from wireless sensor 510 and can determine by comparison to its buffer in memory that the data packet C has not been sent by wireless repeater 530. Wireless repeater 530 can randomly delay between about 25 ms to 100 ms and can then broadcast the data packet C packet at time (t+y), shown as C(t+y). In some embodiments, because data packet C is broadcast, wireless sensor 510 can receive data packet C, the receipt of which can be an acknowledgement of a successful transmission. In the example, wireless repeater 530' can receive data packet C and can determine by comparison to its buffer in memory that the packet has not been sent by wireless repeater 530'. Wireless repeater 530' can randomly delay between about 25 ms to 100 ms and can then broadcast the packet at time (t+x), shown as C(t+x). The packet C(t+x) can be received by wireless repeater 530. Wireless repeater 530 can compare data packet C(t+x) to its buffer in memory, can determined that data packet C(t+y), equivalent to data packet C(t+x) has already been sent, and can discard and/or otherwise ignore data packet C(t+x).

Figure 6:
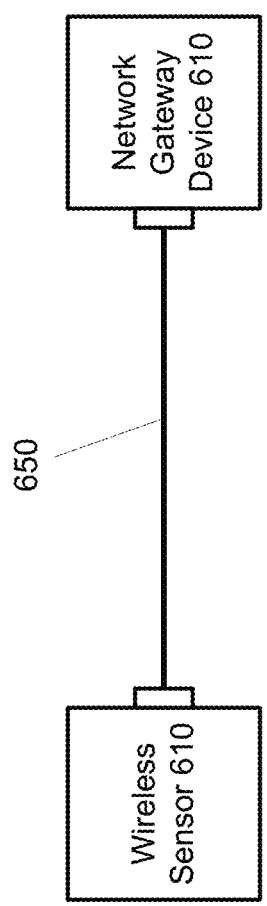
FIG. 6 is a schematic illustration of a wireless sensor coupled to a network gateway device according to an embodiment.

FIG. 6 is a schematic illustration of a wireless sensor 610 and a network gateway device 640 operatively coupled by a cable 650. Wireless sensor 610 and network gateway device 640 can be similar to wireless sensor 110 and network gateway device 140, respectively. FIG. 6 depicts a temporary hardwire connection between wireless sensor 610 and network gateway device 640, for example, during an initial setup process. Network gateway device 640 can assign network ID, channels, data encryption, security keys, and/or any other security feature.

Figure 7:
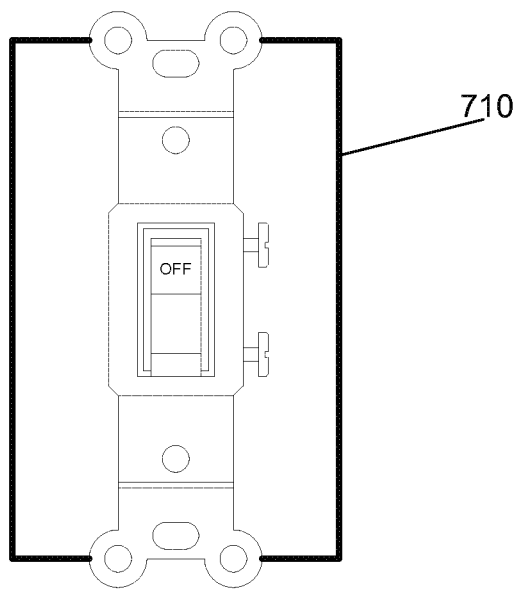
FIG. 7 is an illustration of a wireless sensor according to an embodiment.
Figures 8, 9:
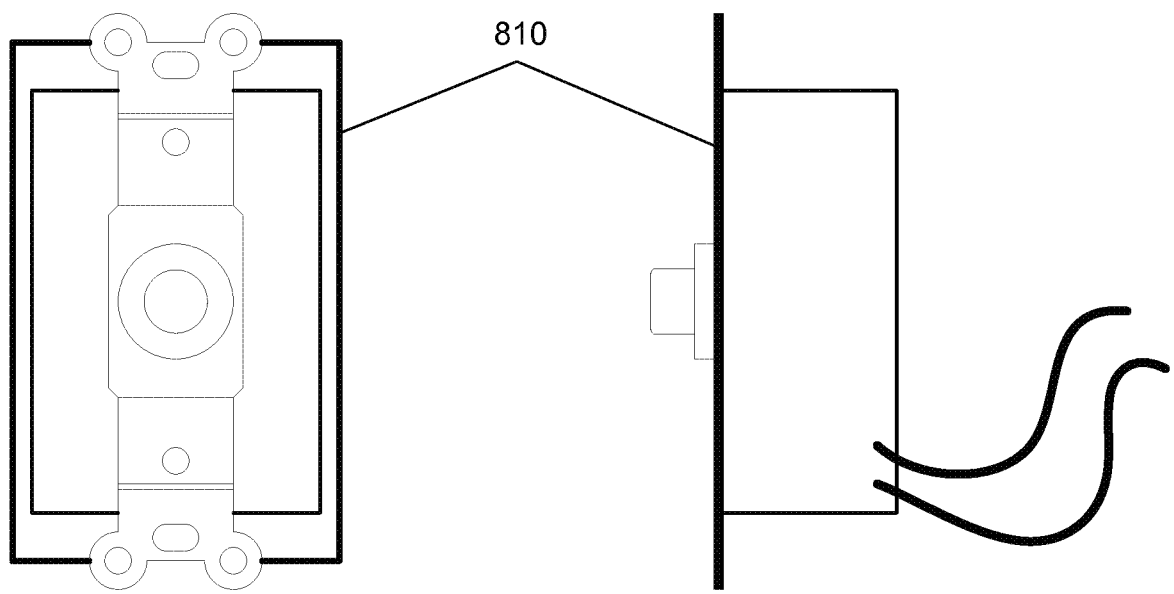
FIG. 8 is an illustration of a front view of a wireless sensor according to an embodiment.
FIG. 9 is an illustration of a side view of the wireless sensor shown in FIG. 8.

FIG. 7 is an illustration of wireless sensor 710, specifically, a rocker type switch. FIG. 8 is an illustration of a front view of a wireless sensor 810, and FIG. 9 is an illustration of a side view of wireless sensor 810, specifically toggle (e.g., momentary) type switch. Wireless sensors 710, 810 can be similar to and can include similar components to wireless sensor 110 described above. Wireless sensors 710, 810 can be configured to be disposed within a standard junction box. In some such embodiments, wireless sensors 710, 810 can include three terminals, and/or wires, to be coupled to a load line, a hot line, and a ground without the need for a neutral wire. In such embodiments, power for operation of the wireless sensor 710, 810 can be obtained by a battery (not shown) contained within the wireless sensor 710,810 that can be mounted at least partially in the junction box. In some embodiments, wireless sensors 710, 810 can harvest energy by trickling a small amount of current from the load line to the ground connection.

Figure 10:
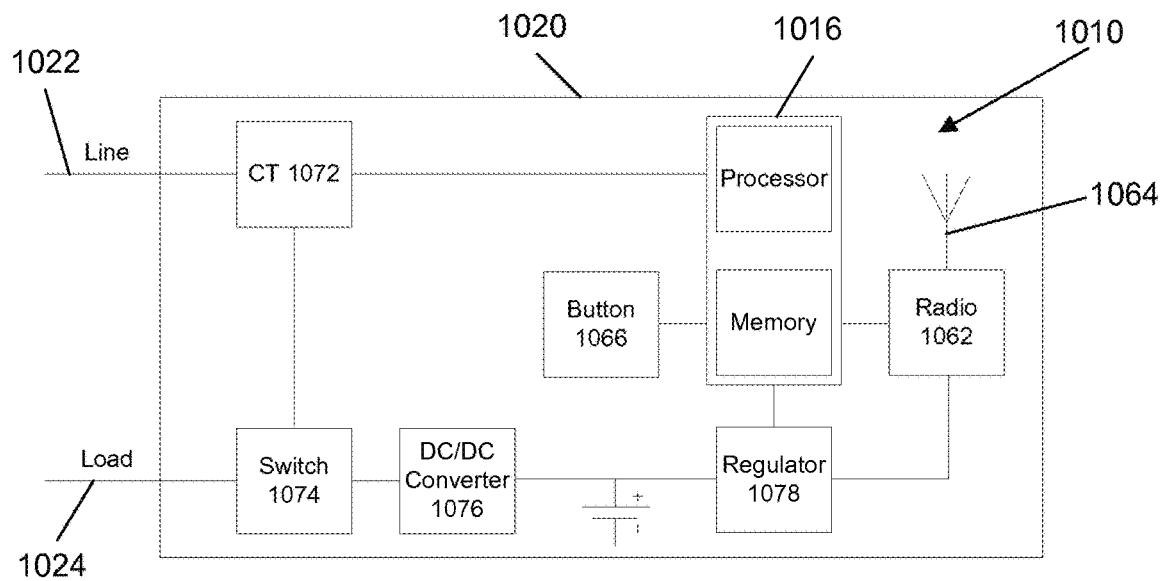
FIG. 10 is a schematic illustration of a wireless sensor and junction box according to an embodiment.
Figure 11:
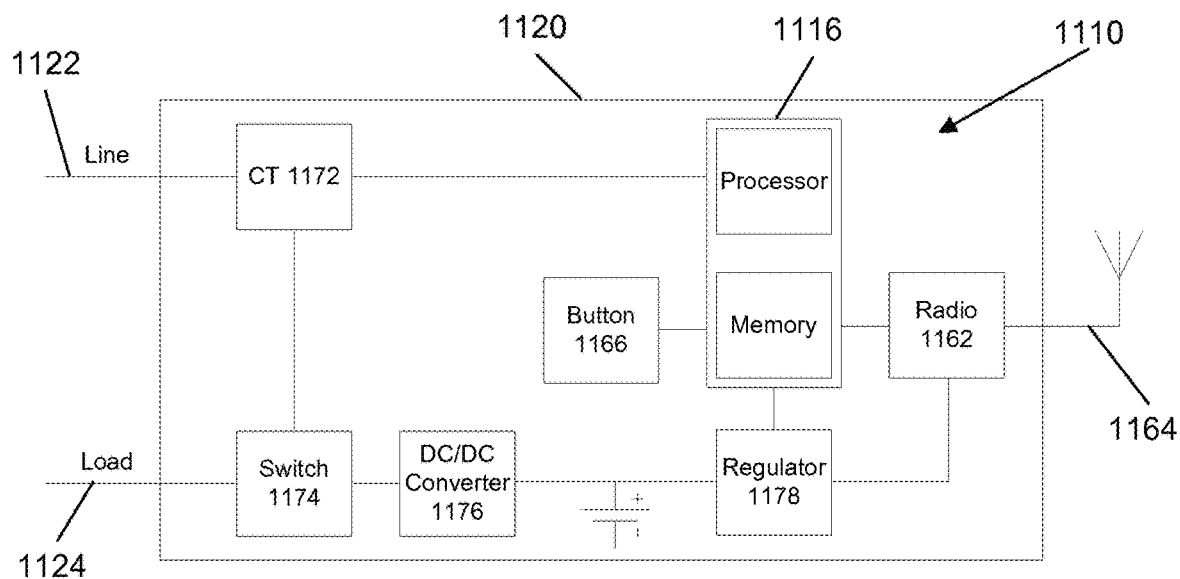
FIG. 11 is a schematic illustration of a wireless sensor and junction box according to an embodiment.
Figure 12:
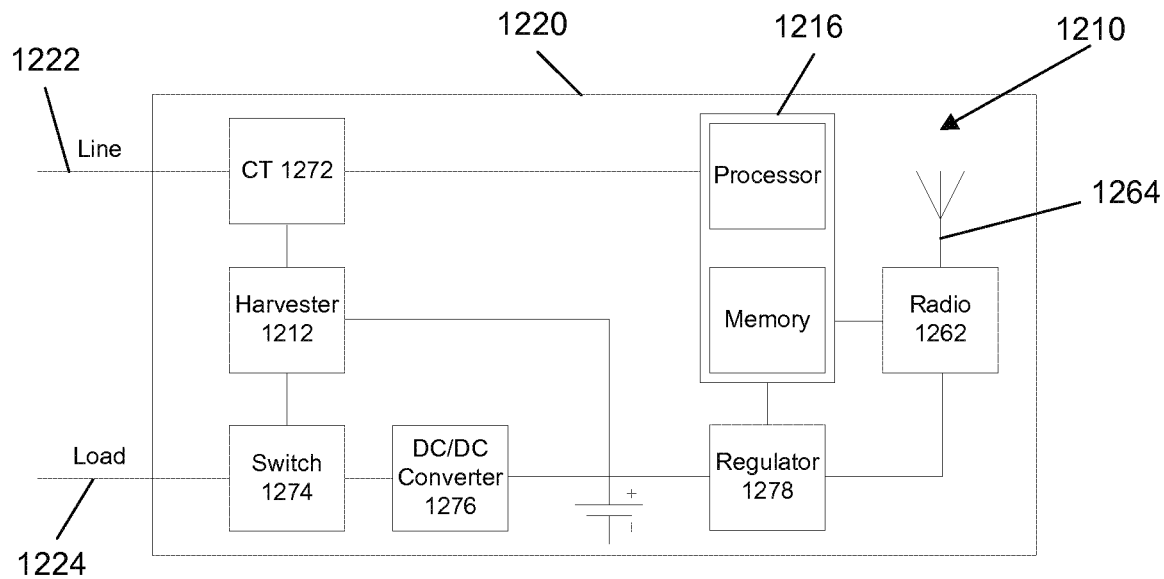
FIG. 12 is a schematic illustration of a wireless sensor and junction box according to an embodiment.
Figure 13:
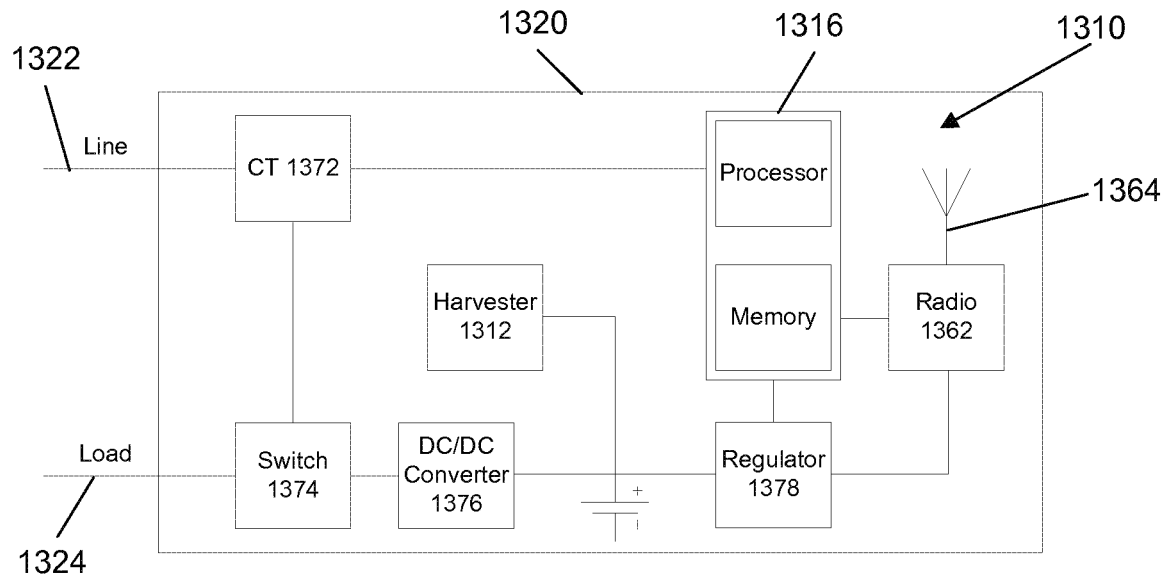
FIG. 13 is a schematic illustration of a wireless sensor and junction box according to an embodiment.
Figure 14:
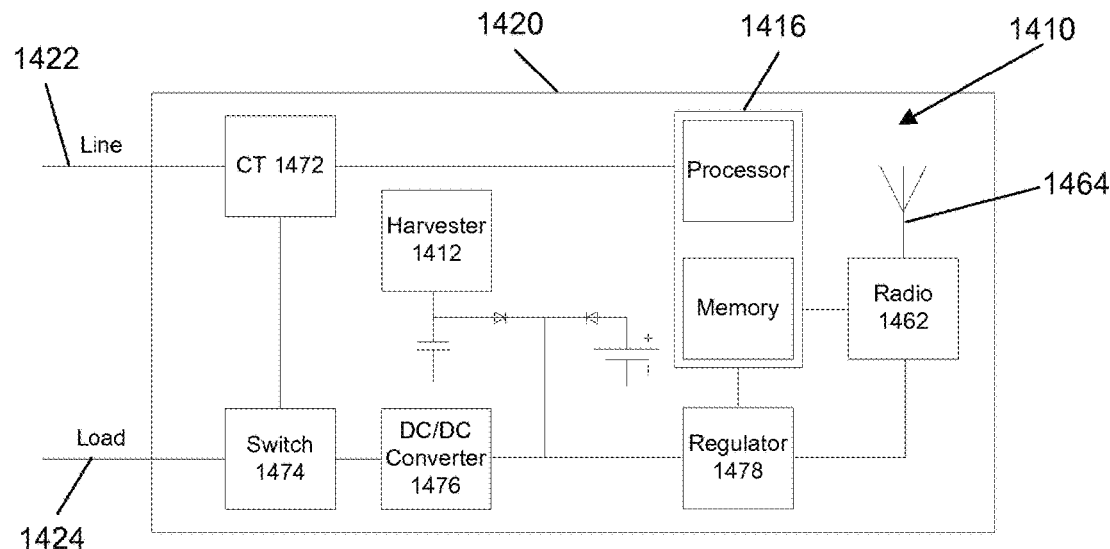
FIG. 14 is a schematic illustration of a wireless sensor and junction box according to an embodiment.
Figure 15:
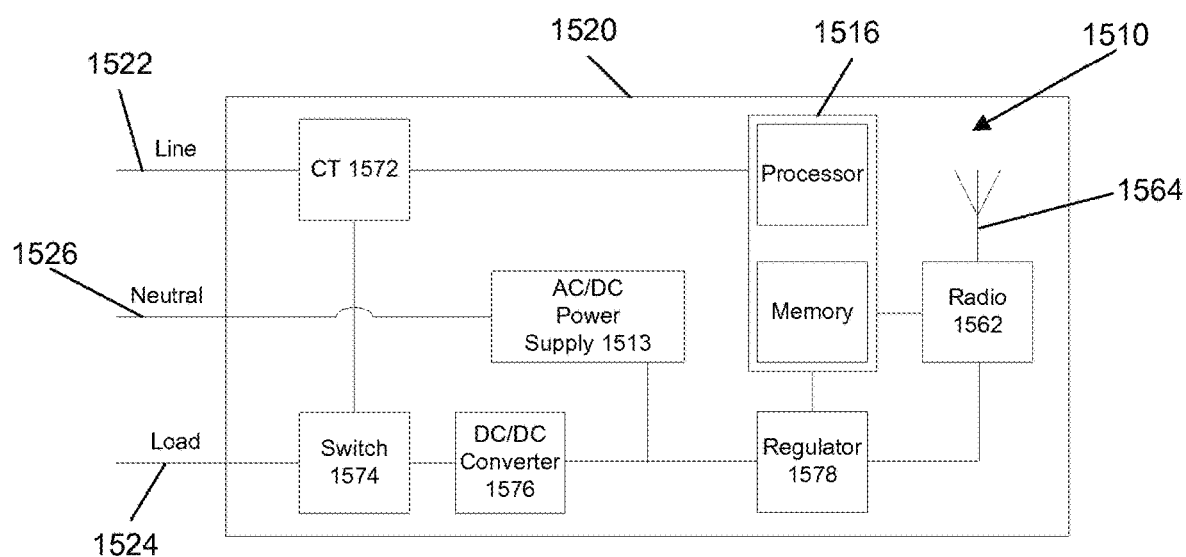
FIG. 15 is a schematic illustration of a wireless sensor and junction box according to an embodiment.

FIGS. 10-15 are schematic illustrations of wireless sensors according to embodiments described herein. Specifically, FIG. 10 illustrates a wireless sensor 1010 including an antenna 1064 disposed within a junction box 1020; FIG. 11 illustrates a wireless sensor 1110 including an antenna 1164 disposed outside a junction box 1120; FIG. 12 illustrates a wireless sensor 1210 including an energy harvester 1212 in a first configuration; FIG. 13 illustrates a wireless sensor 1310 including an energy harvester 1312 in a second configuration; FIG. 14 illustrates a wireless sensor 1410 including an energy harvester 1412 in a third configuration; and FIG. 15 illustrates a wireless sensor 1510 including a power supply 1513 operatively coupled to a junction box 1520. By way of example, a wireless sensor, for example, wireless sensors 1010, 1110, 1210, 1310, 1410, 1510 can include a light or outlet switch configured to sense and/or control whether an electrical switch controlling a light or outlet is opened or closed.

Referring to FIG. 10, wireless sensor 1010 can be at least partially disposed within electrical enclosure 1020, and can include a processor module 1016, a radio 1062, an antenna 1064, a button 1066, a current transformer 1072, a switch 1074 (as an example a relay or TRIAC), a DC/DC converter 1076, and a regulator 1078. Wireless sensor 1010 can operate as a light switch. For example, when button 1066 is pressed, lights associated with wireless sensor 1010 would turn ON or OFF by connecting or disconnecting the load to the AC mains 1022, 1024 (preferably at 120-277 VAC, 50 or 60 Hz). Wireless sensor 1010 can be configured such that, when button 1066 is pressed on, an interrupt is generated within the processor 1016, which can bring wireless sensor 1010 out of a sleep mode. The processor 1016 can toggle a state of switch 1074 to power or de-power a load (e.g. lights) coupled to wireless sensor 1010. Processor 1016 can send, using radio 1062 and antenna 1064, a change of state of wireless sensor 1010, based on, for example, a state of switch 1074, to, for example, a building automation system (BAS) via a wireless sensor system, for example, as described above. In some embodiments, processor 1016 can store the state of the switch and go back to sleep. In such embodiments, processor 1016 can transmit data packets associated with the state on a predetermined schedule and/or at a predetermined interval. Current transformer 1072 can measure an amount of current provided to the load and can send a value if the current provided to the data processor 1016, such that the data processor 1016 can define and send a data packet can to, for example, the BAS, via a wireless sensor system. In some embodiments, antenna 1064 can use at least a portion of electrical enclosure 1020 as part of the antenna 1064. In such embodiments, a radio frequency (RF) current can flow on the exterior of the electrical enclosure 1020 in support of radiation of the wireless (RF) data signal.

In some embodiments, the BAS can monitor the energy usage of the load. In such embodiments, a building having many standard (e.g., not wireless sensors) switches, outlets, and sensors, can be retrofitted with wireless sensors described herein to allow the BAS to wirelessly control the loads on all switches and outlets, in addition to local control by a user. In some embodiments, a BAS may have a schedule of when a room is occupied and unoccupied and use that data to switch ON and OFF wireless sensors within that room. In such embodiments, a user can be in a room labeled unoccupied, and can manually operate the switch to enable the load. In some embodiments, a wireless sensor can include a timer to maintain an ON state a predetermined or programmable time such as one hour. In such embodiments, the wireless sensor can listen for data from the BAS as to whether the room is still labeled unoccupied based on the schedule. When the room is still labeled as unoccupied, the wire sensor can electronically remove power from the load.

Referring to FIG. 11, wireless sensor 1110 can be at least partially disposed within electrical enclosure 1120, and can include a processor module 1116, a radio 1162, an antenna 1164, a button 1166, a current transformer 1172, a switch 1174, a DC/DC converter 1176, and a regulator 1178. Electrical enclosure 1120 can include AC mains 1122, 1124. Wireless sensor 1110 can be similar to and include similar components as wireless sensor 1010. For example, wireless sensor can include a processor module 1116 similar to processor module 1016. Unlike wireless sensor 1010 depicted in FIG. 10, antenna 1164 of wireless sensor 1110 is at least partially disposed outside of electrical enclosure 1120.

Referring to FIG. 12, wireless sensor 1210 can be at least partially disposed within electrical enclosure 1220, and can include the energy harvester 1212, a processor module 1216, a radio 1262, an antenna 1264, a button (not shown in FIG. 12), a current transformer 1272, a switch 1274, a DC/DC converter 1276, and a regulator 1278. Electrical enclosure 1220 can include AC mains 1222, 1224. Wireless sensor 1210 can be similar to and include similar components as wireless sensor 1010. For example, wireless sensor 1210 can include a processor module 1216 similar to processor module 1016. Unlike wireless sensor 1010 depicted in FIG. 10, wireless sensor 1210 includes an energy harvester 1212, which can be similar to the energy harvesters described above. Specifically, when energy harvester 1212 is in the first configuration, for example, energy harvest 1212 can harvest energy from the current flowing through wireless sensor 1210. Energy harvester 1212 can transform a small portion of the current to a usable voltage. The voltage can be rectified to DC and can be used to recharge a battery or another storage device such as a supercapacitor. As shown in FIG. 12, energy harvester 1212 can only harvest energy when the switch 1274 is closed, connecting the line 1222 to the load 1224. In some embodiments, energy harvester 1212 can trickle a small current through a ground wire (not shown) which can enable the wireless sensor 1210 to harvest energy from the line 1222 when the load 1224 is disconnected by the switch 1274. In such embodiments, the trickle current can be less than 6 mA, specifically, less than 3 mA.

Referring to FIG. 13, wireless sensor 1310 can be at least partially disposed within electrical enclosure 1320, and can include the energy harvester 1312, a processor module 1316, a radio 1362, an antenna 1364, a button (not shown in FIG. 13), a current transformer 1372, a switch 1374, a DC/DC converter 1376, and a regulator 1378. Electrical enclosure 1320 can include AC mains 1322, 1324. Wireless sensor 1310 can be similar to and include similar components as wireless sensor 1010. For example, wireless sensor 1310 can include a processor module 1316 similar to processor module 1016. Unlike wireless sensor 1010 depicted in FIG. 10, wireless sensor 1310 includes an energy harvester 1312, which can be similar to the energy harvesters described above. Specifically, when energy harvester 1312 is in the second configuration, for example the energy harvester 1312 can be independent from the AC circuit. More specifically, in some embodiments, energy harvester 1312 can be a solar cell. In such embodiments, the solar cell can be designed to be exposed to the outside of wireless sensor 1310 through a face plate. The face plate can be a standard design or may be custom and integrated in the wireless sensor 1310.

Referring to FIG. 14, wireless sensor 1410 can be at least partially disposed within electrical enclosure 1420, and can include the energy harvester 1412, a processor module 1416, a radio 1462, an antenna 1464, a button (not shown in FIG. 14), a current transformer 1472, a switch 1474, a DC/DC converter 1476, and a regulator 1478. Electrical enclosure 1420 can include AC mains 1422, 1424. Wireless sensor 1410 can be similar to and include similar components as wireless sensor 1010. For example, wireless sensor can include a processor module 1416 similar to processor module 1016. Unlike wireless sensor 1010 depicted in FIG. 10, wireless sensor 1410 includes an energy harvester 1412, which can be similar to the energy harvesters described above. Specifically, when energy harvester 1412 is in the third configuration, for example, energy harvester 1412 can be designed to provide power to wireless sensor 1410 independent of a battery. In such embodiments, energy harvester 1412 and the battery may be diode OR-ed. In some embodiments, when the source of energy used for harvesting is not present (i.e. no light) a battery can be the primary source of energy to power the wireless sensor 1410. In such embodiments, as the source of energy used for harvesting increases, e.g., as the ambient light in a room increases, energy harvester 1412 can augment the battery. In such embodiments, when the source of energy used for harvesting reached a large enough value, energy harvester 1412 can be the primary source of energy to power wireless sensor 1410. In some embodiments, all energy may be provided by energy harvester 1412 and no energy may be provided to the battery to power the wireless sensor 1410. In such embodiments, if energy harvester 1412 has sufficient energy, it can power wireless sensor 1410 and maintain the battery energy. In some embodiments, energy harvester 1412 can charge a supercapacitor or rechargeable battery.

Referring to FIG. 15, wireless sensor 1510 can be at least partially disposed within electrical enclosure 1520, and can include the power supply 1513, a processor module 1516, a radio 1562, an antenna 1564, a button (not shown in FIG. 15), a current transformer 1572, a switch 1574, a DC/DC converter 1576, and a regulator 1578. Electrical enclosure 1520 can include AC mains 1522, 1524 and neutral 1526. Wireless sensor 1510 can be similar to and include similar components as wireless sensor 1010. For example, wireless sensor can include a processor module 1516 similar to processor module 1016. Unlike wireless sensor 1010 depicted in FIG. 10, wireless sensor 1510 includes a power supply 1513. Specifically, because electrical enclosure 1520 includes a neutral line 1026, wireless sensor 1510 can receive power from, for example, building electricity. Power supply 1513 can include an AC/DC converter.

As described herein, with reference to FIGS. 10-15, a wireless sensor may adjust or dim the electrical connection on the load wire via any method such as chopping the AC input from the line wire or by a 0-10V signal to an external dimming device (not shown).

Figure 16:
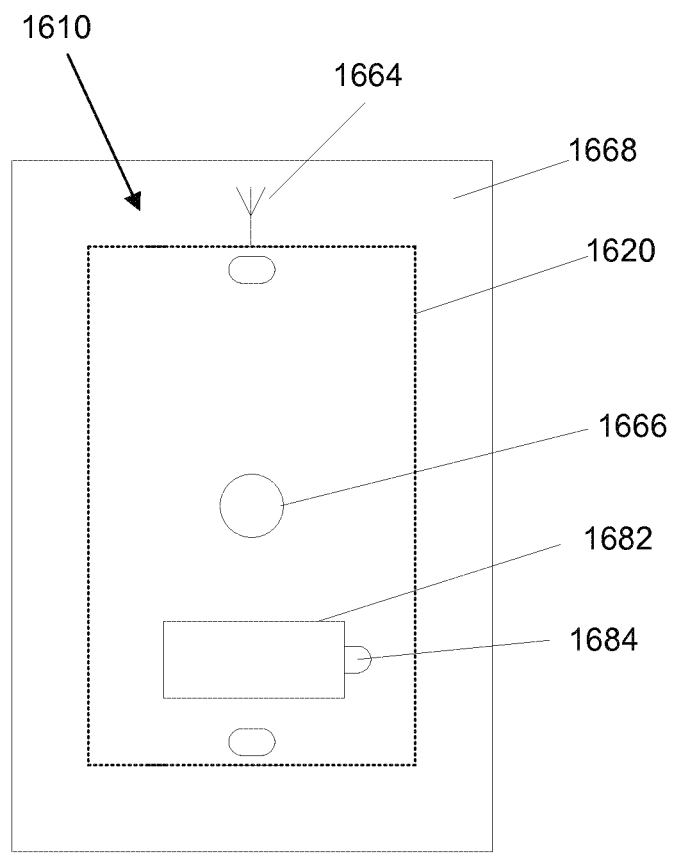
FIG. 16 is an illustration of a wireless sensor, a faceplate, and a junction box according to an embodiment.

FIG. 16 is an illustration of a portion of a wireless sensor 1610 disposed within a electrical enclosure 1620. Specifically, wireless sensor 1610 includes an antenna 1664, a faceplate 1668, a button 1666, a battery compartment door 1682 and a battery compartment door securing device 1684. As shown in FIG. 16, antenna 1664 can be disposed within and/or adjacent to faceplate 1668. Battery compartment door 1682 can provide access for installing and/or replacing a battery (not shown). Battery compartment door securing device 1684 secures batter compartment door 1682 in a closed position and can include, for example, a screw or snapping mechanism. In some embodiments, button 1666 may be implemented using capacitive touch technology using one or more sensing locations. In some embodiments, button 1666 may give the ability to control the switch and also dim the electrical connection between a line wire and a load wire.

As described herein, with reference to FIGS. 1-16, a wireless sensor can be, at least partially disposed within an electrical enclosure, specifically a junction box, and one or more antennas can be disposed internal, external, partially internal, or integral to the junction box. In some embodiments, a characteristic of the junction box can determine a positioning of an antenna. In some embodiments, the junction box can include metal or can include plastic. In some embodiments, a faceplate associated with the junction box and/or wireless sensor can include plastic and allow the antenna mounting within the junction box and RF energy can exit the box through the plastic face plate when the junction box is metal. Alternatively, when the junction box is plastic, RF energy can exit through both the face plate and junction box. In some embodiments, the antenna can exit the junction box to maximize performance by minimizing the influence of the metal junction box. In some embodiments, the antenna may be cabled to the junction box or may be panel mounted on the side or top of the junction box, a stud, or a wall.

In some embodiments, the antenna may use a junction box or metal of a light fixture as a ground plane or as part of the antenna's radiating structure. In some embodiments, the antenna can also be formed by using a metal junction box and metal face plate and using a slot within the face plate. By way of example, a junction box can be metal. The metal of the junction box can prevent a standard antenna from working properly because the junction box can shield radiation and/or detune the antenna. Placing a metal cover over the junction box with a slot with the proper dimensions can enable radiation from the junction box. Preferably, the slot runs along the long side of the junction box and is feed from a transmission line that has no physical connection to the slot or earth ground of the junction box. Preferably, a dielectric, such as but not limited to, FR4, is present between the slot antenna and the transmission line to provide electrical isolation at the frequency of the AC line or from the DC voltage. The isolation allows the use of a non-isolated power supply to conform to UL requirements.

In some embodiments, the antenna may use a junction box or metal of a light fixture as a ground plane for the antenna without a physical connection of the RF ground of the radio to the earth ground of the junction box. Isolation between the grounds is performed using a dielectric. The RF signal establishes a virtual ground connection using the capacitance formed between the RF ground and earth ground through the dielectric. In some cases, the printed circuit board (PCB) containing the radio may be completely inside a junction box or under a ballast cover effectively making the PCB shielded from the outside world. A wire antenna can be fed out through a small hole in the metal so it is substantially orthogonal to a plane of the metal. A virtual ground can be established from the PCB ground plane to the metal of the junction box or metal of the light fixture to excite RF current in the junction box or metal of the light fixture to make the wire and non-ground (isolated) metal of the junction box or metal of the light fixture resonant as seen by the radio. The dielectric used is preferably the ABS plastic of the enclosure combined with the adhesive (if used) such as double sided tape.

In some embodiments, an antenna can use metal of a junction box as part of the antenna to improve performance. In such embodiments, the antenna can use a plastic junction box cover. In such embodiments, the antenna structure includes a metal plane, orthogonal metal wings, and a point fed plane. The point fed plane can be constructed on a dielectric such as FR4 and can also have a superstrate that can cover the plane, and can be made of a second dielectric, for example, plastic. In such embodiments, the antenna is a hybrid between a patch antenna, an inverted-F antenna, and a dipole antenna. Additionally, the metal plane includes orthogonal wings to ensure resonance in a multi-gang or plastic junction box. In such an embodiment, the junction box acts as half of a dipole antenna while the point fed plane acts as the other half. The metal plane under the point fed plane can force the current associated with an RF wave to flow on the outside of the junction box to form a dipole type antenna (the point fed plane can be the positive side of the dipole and the metal plane combined with the junction box metal and orthogonal wings can be the negative side of the dipole). In another example, the junction box is a plastic junction box, and orthogonal wings allow the current associate with an RF wave to flow rearwards as is the case in a metal junction box. This can allow the resonance of the antenna to be maintained (return loss less then −7 dB). Said another way, the resonant frequency of an antenna occurs when the impedance of the antenna is the complex conjugate for the source or load impedance. In an example, an antenna can be designed to be 50 ohms to match the 50 impedance of the connected radio transceiver. In such an example, return loss can be a measure of how close to 50 ohms (or other impedance for non-50 ohm systems) the antenna is. In the example, a return loss of less than −10 dB can be a good match, e.g. the antenna is resonant at that frequency or over that frequency range. Additionally, the orthogonal wings can allow the antenna to stay in resonance when mounted in a multi-gang metal junction box. In some embodiments, the metal plane and metal orthogonal wings can be formed from a single piece of bent metal. The orthogonal wings can be spaced, for example, at least 1 mm from the junction box walls. In some embodiments, the antenna can be used as part of a button in a wireless sensor. In some embodiments, the point fed point can be used as part of the antenna and as a capacitive touch button to eliminate the mechanical motion of the antenna.

Figure 17:
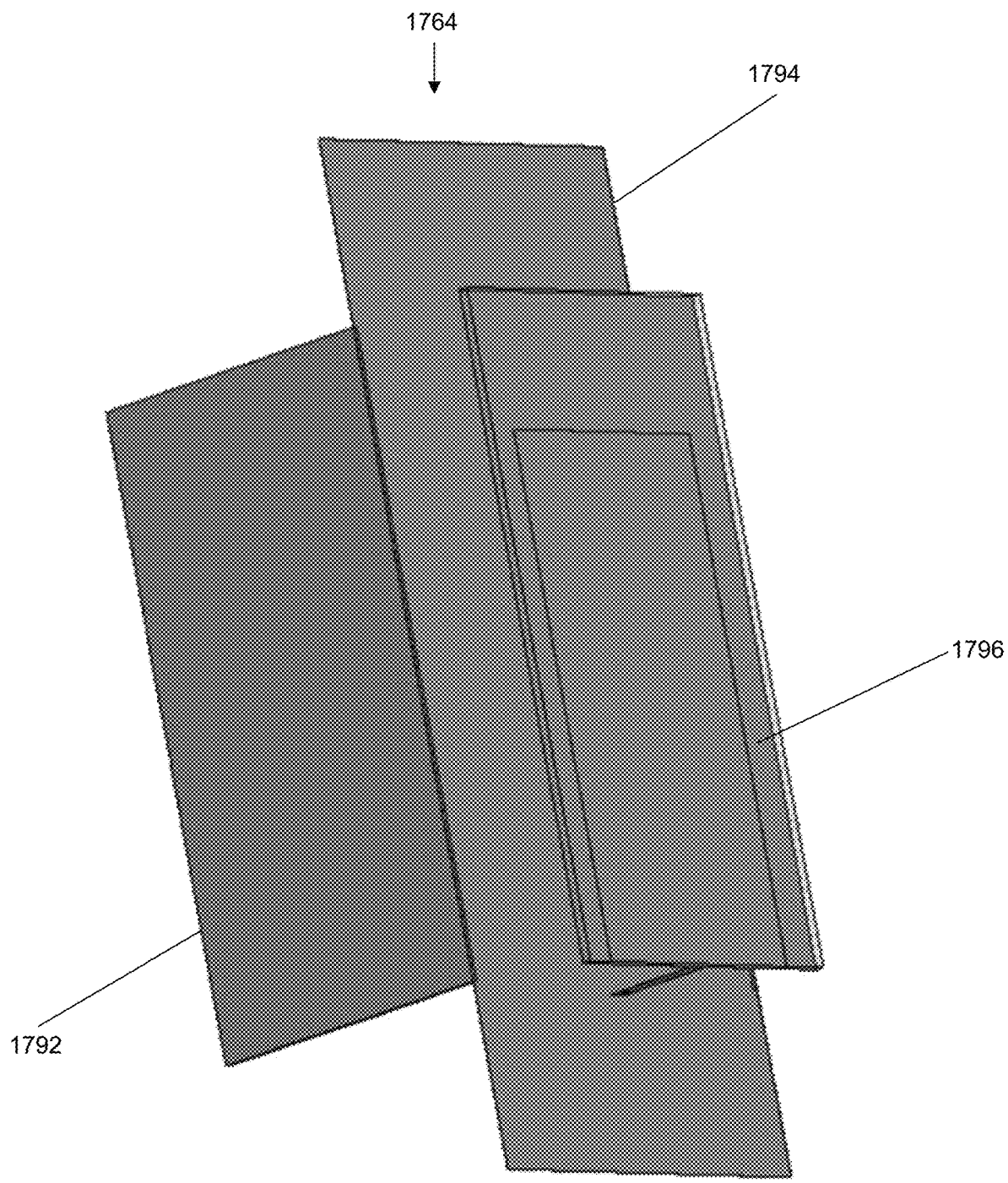
FIG. 17 is an illustration of a front perspective view of an antenna of a wireless sensor according to an embodiment.
Figure 18:
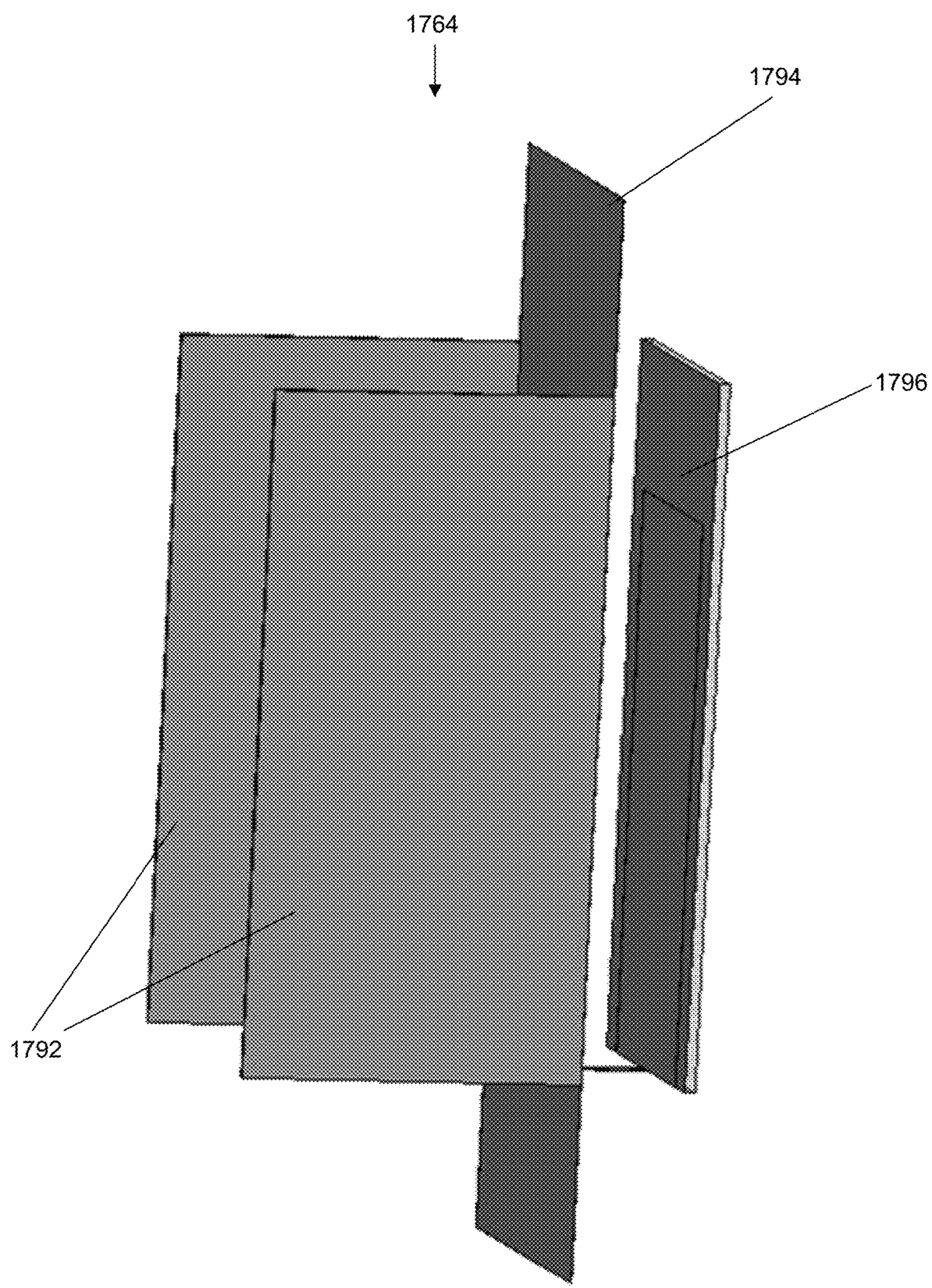
FIG. 18 is an illustration of a rear perspective view of the antenna shown in FIG. 17.
Figure 19:
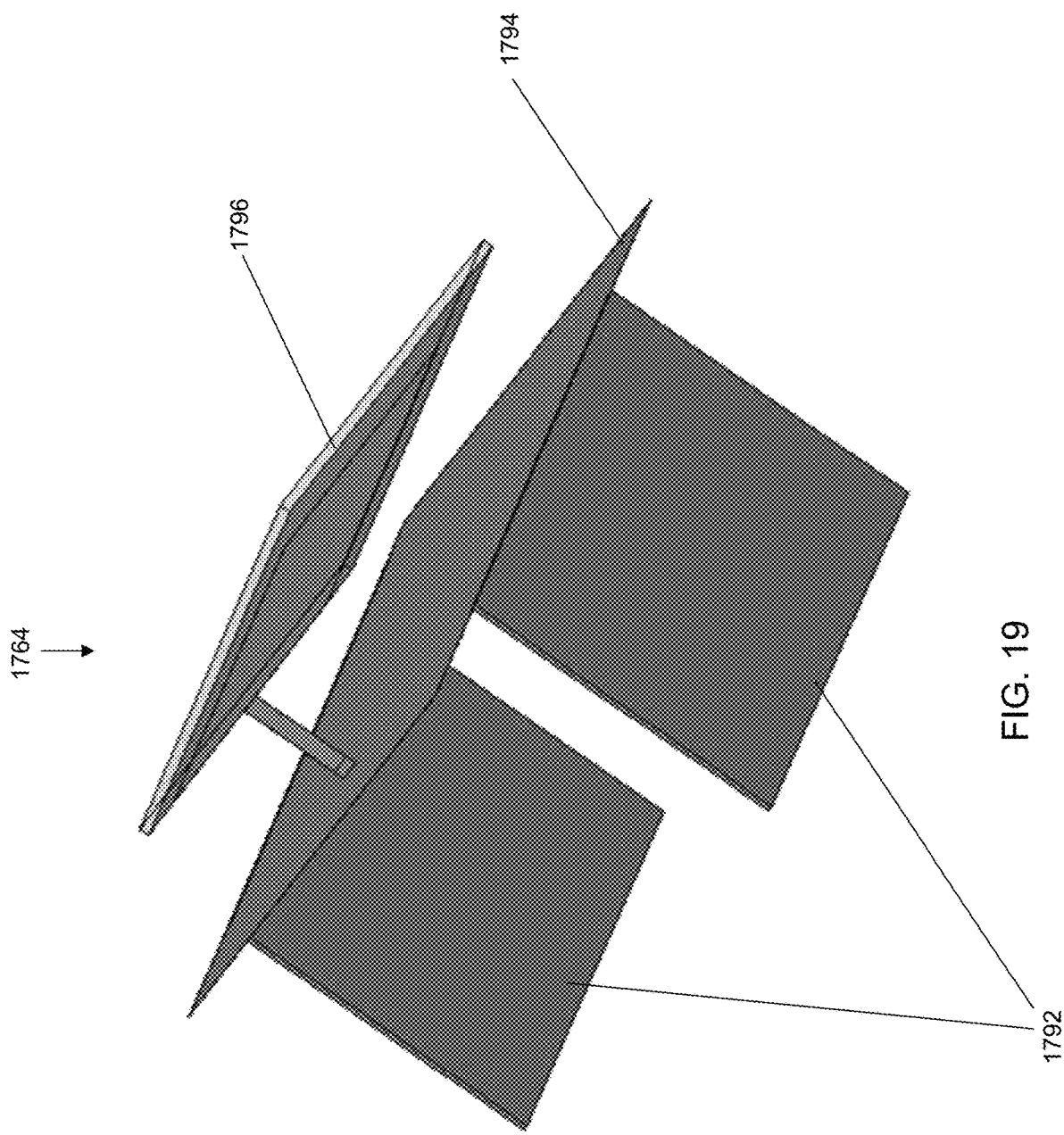
FIG. 19 is an illustration of a second rear perspective view of the antenna shown in FIG. 17.
Figure 20:
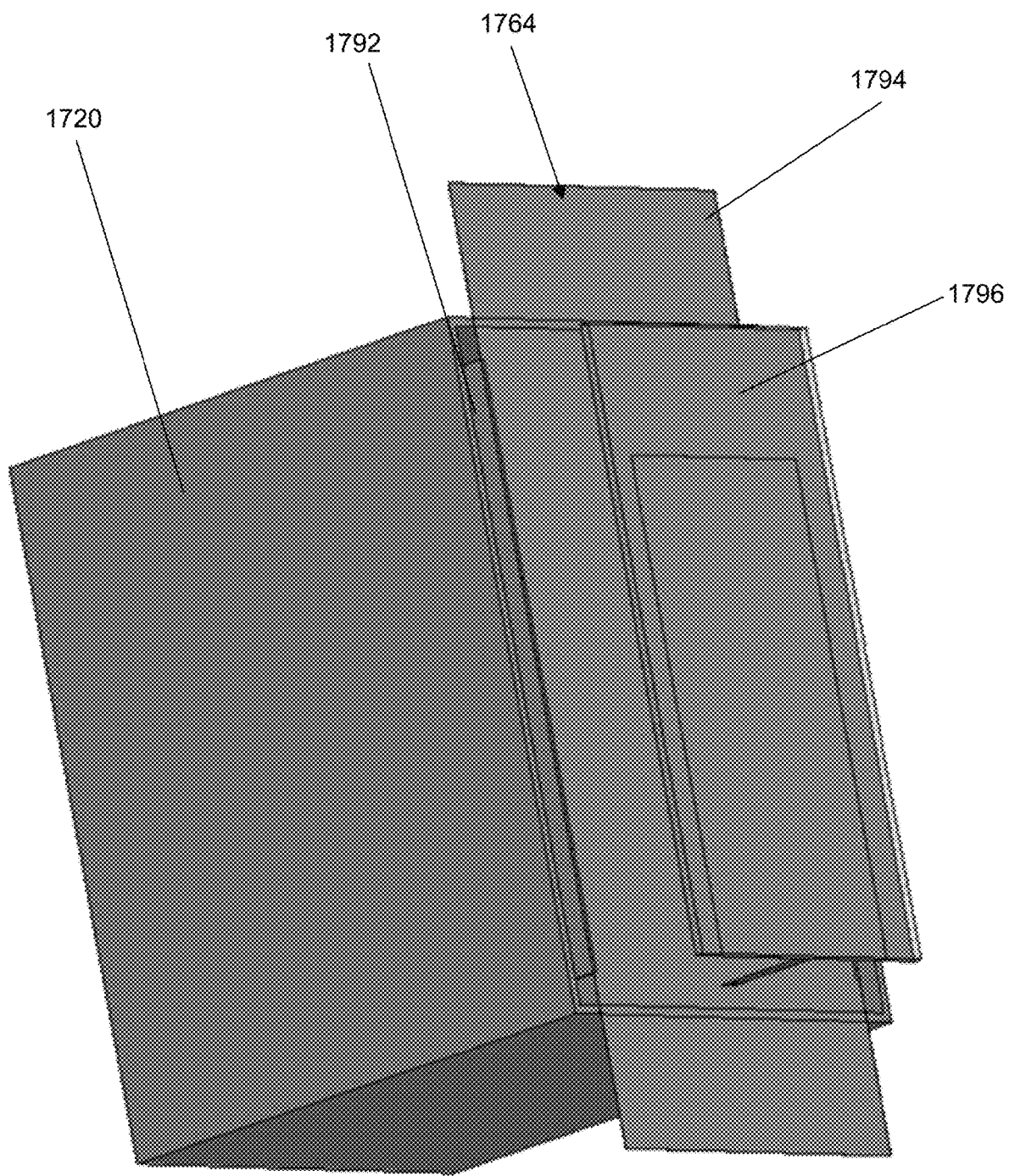
FIG. 20 is an illustration of a front perspective view of the antenna shown in FIG. 17 at least partially disposed in a junction box according to an embodiment.
Figure 21:
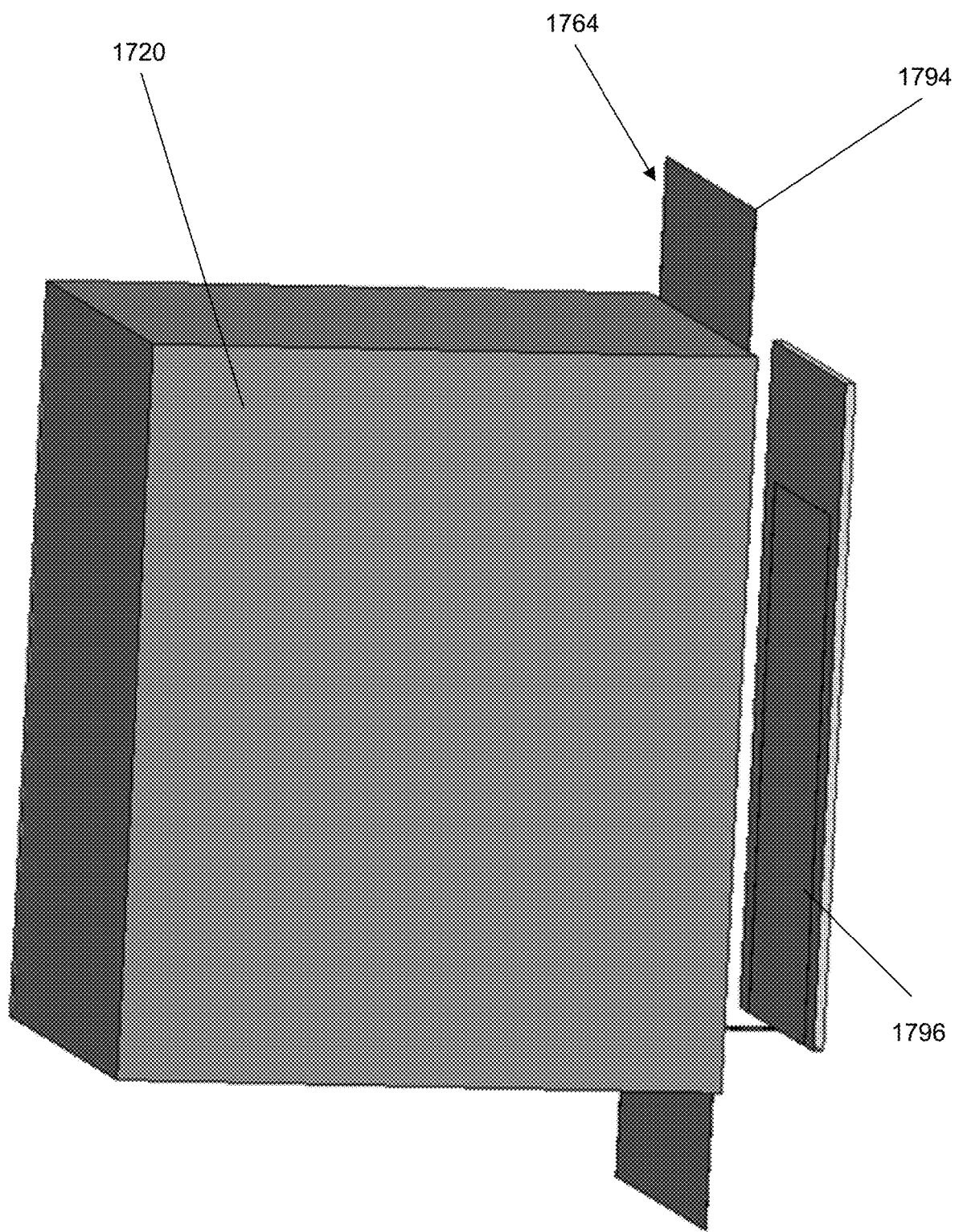
FIG. 21 is an illustration of a rear perspective view of the antenna shown in FIG. 17 at least partially disposed in a junction box according to an embodiment.
Figure 22:
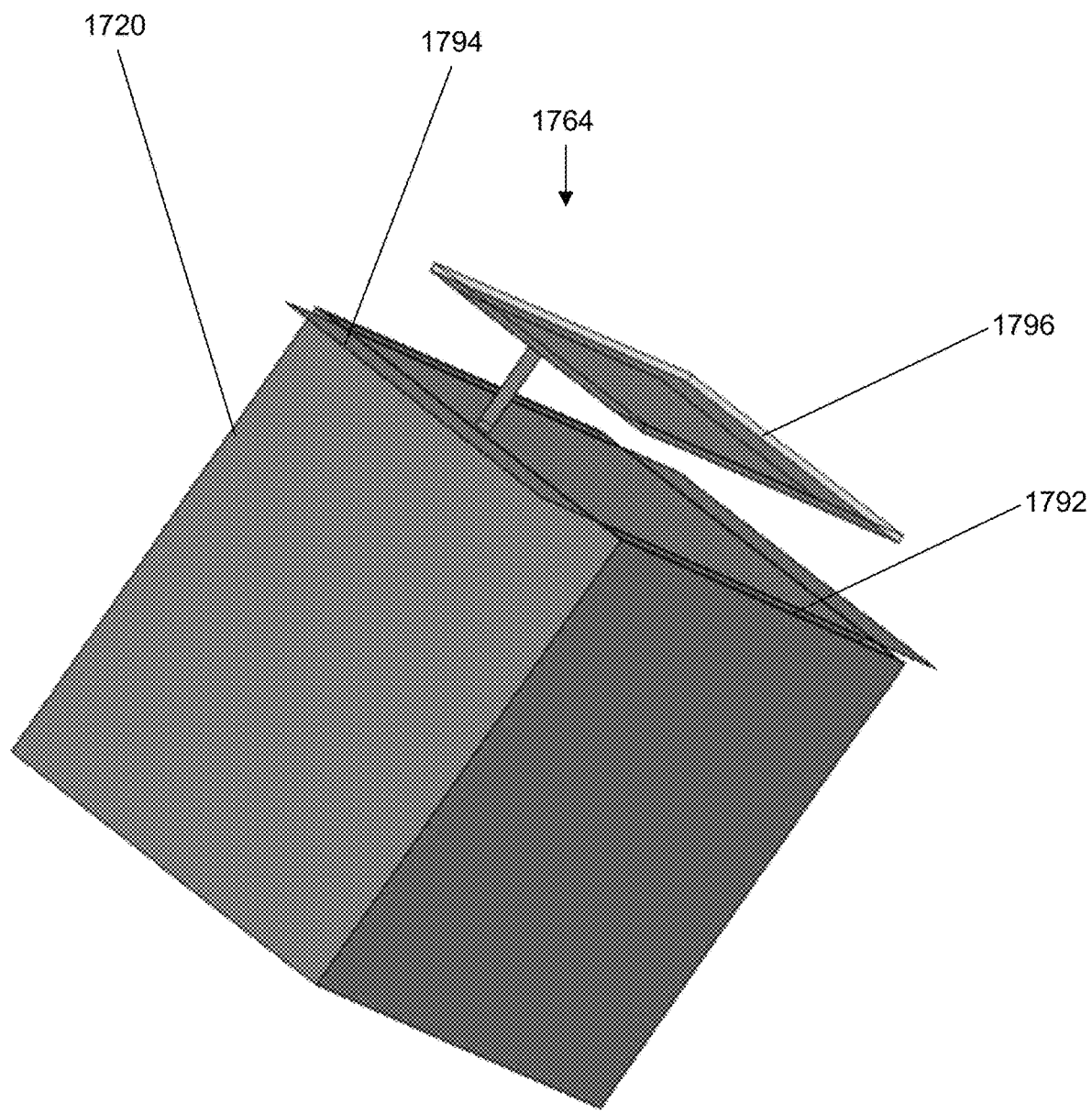
FIG. 22 is an illustration of a second rear perspective view of the antenna shown in FIG. 17 at least partially disposed in a junction box according to an embodiment.

FIGS. 17-22 depict illustrations of various views of an antenna of a wireless sensor with and without an associated junction box. Specifically, FIG. 17 is an illustration of a front perspective view of an antenna of a wireless sensor according to an embodiment; FIG. 18 is an illustration of a rear perspective view of the antenna shown in FIG. 17; FIG. 19 is an illustration of a second rear perspective view of the antenna shown in FIG. 17; FIG. 20 is an illustration of a front perspective view of the antenna shown in FIG. 17 at least partially disposed in a junction box according to an embodiment; FIG. 21 is an illustration of a rear perspective view of the antenna shown in FIG. 17 at least partially disposed in a junction box according to an embodiment; and FIG. 22 is an illustration of a second rear perspective view of the antenna shown in FIG. 17 at least partially disposed in a junction box according to an embodiment. As shown in FIGS. 17-22, an antenna 1764 includes a metal plane 1794, orthogonal wings 1792, and a point fed plane 1796. Also as shown in FIGS. 20-22, antenna 1764 can be at least partially disposed in a junction box 1720.

A lighting control system can be used as part of a BAS for the control, configuration and analysis of lighting systems in spaces (e.g., open and/or enclosed rooms, areas, etc) in a building. In some embodiments, lighting control systems can be used when a person physically occupies a space based on that person's interaction with the lighting control system. In some embodiments, lighting control systems can be used when a person does not physically occupy a space based on motion detected, or not detected, in that space. In some embodiments, lighting control systems can be used based on a schedule and/or characteristics of an environment of a space. Lighting control systems can include wireless controllers, lights, motion and other sensors, wireless switches, and gateways and other networking systems. Lighting control systems can be integrated with the BAS via local and/or wide area networks and/or cloud based networks.

Figure 23:
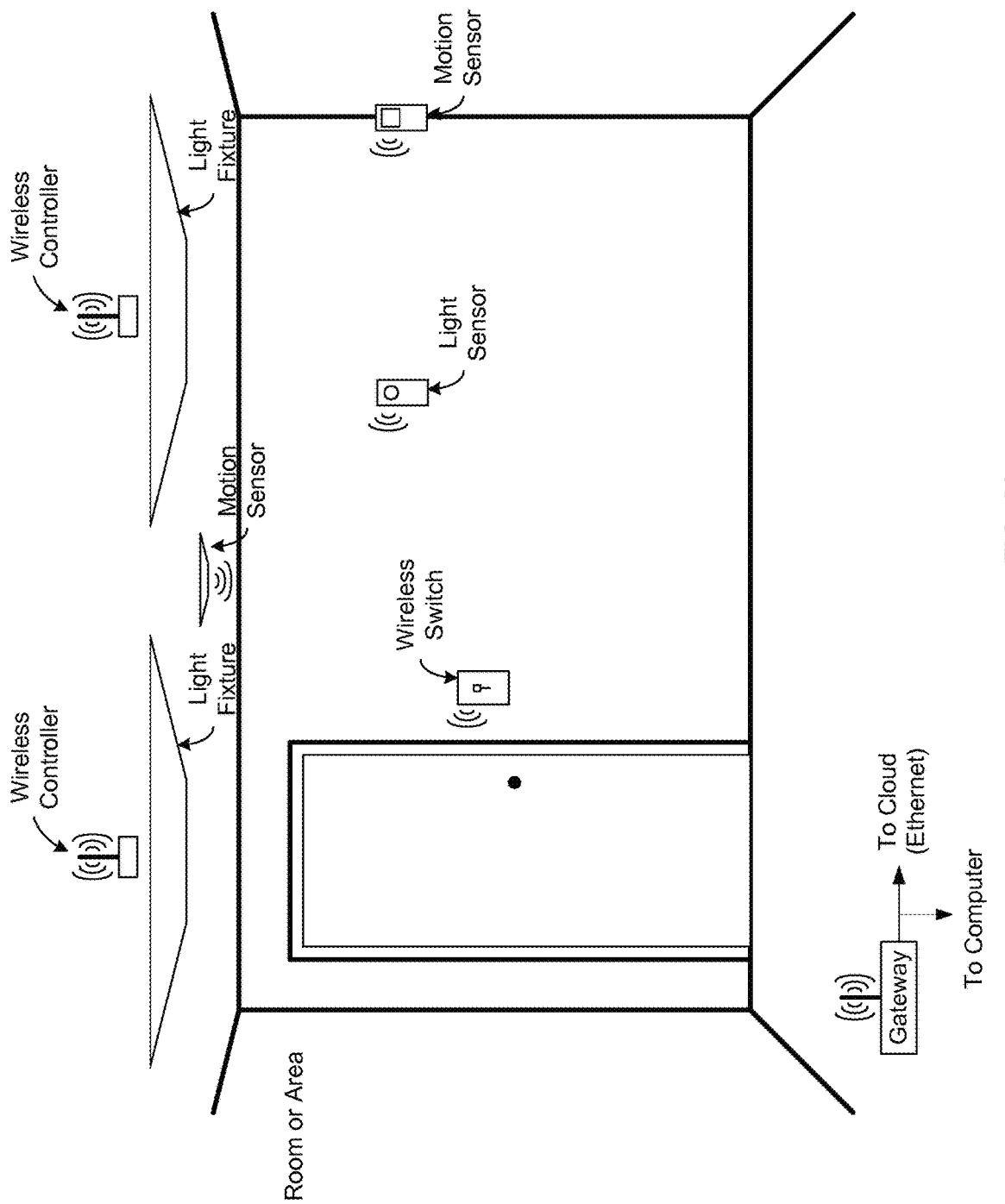
FIG. 23 is a schematic illustration of a lighting control system according to an embodiment.

FIG. 23 is a schematic illustration of a lighting control system ("system") 2300. System 2300 includes wireless controllers 2310 mounted within or mounted to light fixtures 2320, a wireless switch 2330, motion sensors 2340, light sensor 2350, a gateway 2360, a proxy server (not shown), and a cloud server (not shown).

Wireless switch 2330 can be configured to control the state of, for example, a light fixture such as one or both of light fixtures 2320. In some instances, wireless switch 2330 can be a battery operated device. In such instances, a battery (not shown) of wireless switch 2330 can be coupled to an energy harvester as described herein. In some instances, wireless switch 2330 can be a transmit-only device. In other instances, wireless switch 2330 can be configured to receive information from other devices of system 2300. In instances where wireless switch 2330 is configured as a transmit-only switch, wireless switch 2330 can last 25 years or more on a single pre-installed (e.g., soldered) battery. In some instances, wireless switch 2330 can have no moving parts. Such a lack of moving parts can increase the usable lifetime.

Figure 26B:
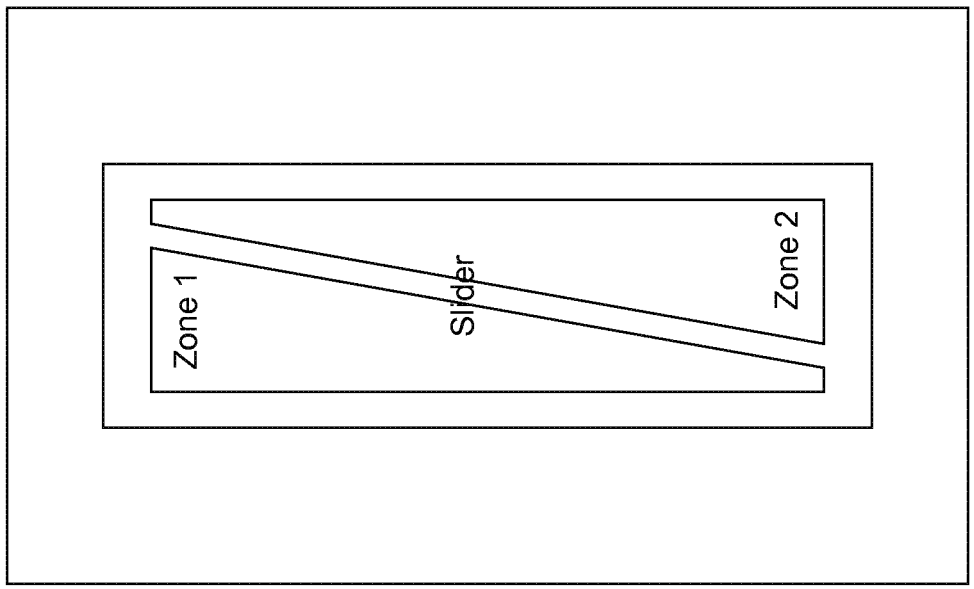
FIGS. 26A and 26B are schematic illustrations of a wireless switch according to a first and second embodiment, respectively.
Figure 26A:
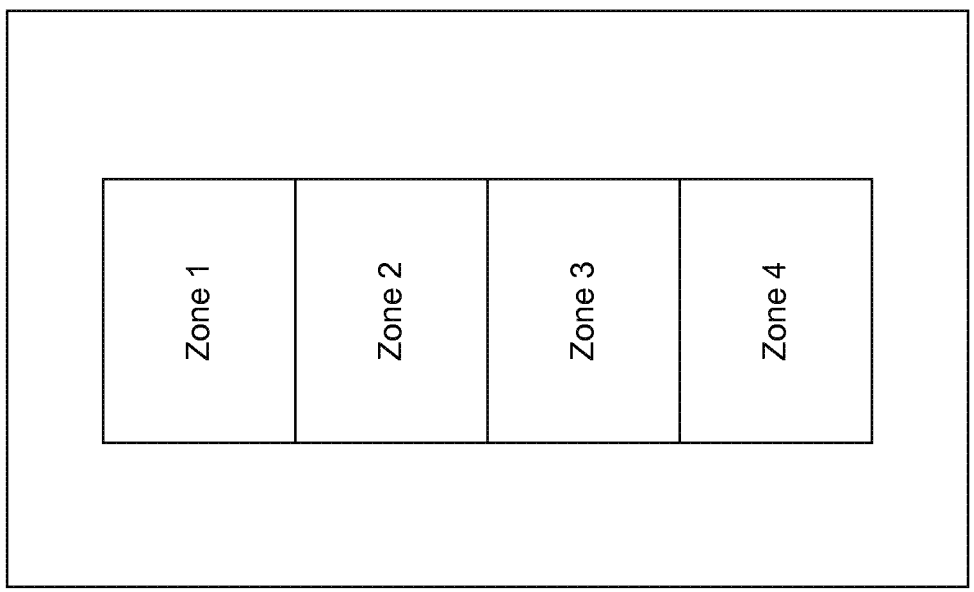

In some instances, wireless switch 2330 can use capacitive sensing to indicate interaction from a user. In such an instance, the user can touch a zone on wireless switch 2330, the capacitance change can be sensed by wireless switch 2330, and a command based on the zone that is pressed can be transmitted. As an example and with reference to FIG. 26, a wireless switch 2630a may have four zones. The first zone (e.g., "Zone 1" in FIG. 26A) shown at the top of wireless switch 2630a can be used to indicate that the user wants the lights in a room to turn on. The zone below Zone 1 (e.g., "Zone 2" in FIG. 26A) can be used to indicate that the user wants the light level in the room to increase. The zone below Zone 2 (e.g., "Zone 3" in FIG. 26A) can be used to indicate that the user wants the light level in the room to decrease. The zone at the bottom (e.g., "Zone 4" in FIG. 26A) can be used to indicate that the user want the lights in a room to turn off. In another example, Zones 1-4 can be used to set the room or area to a user definable scene. Preferably, the wireless switch 2330 does not store data about the scene setting. Preferably, the scene data is stored in the one or more wireless controllers 2310 in the room that are associated to the wireless switch 2330. The wireless switch preferably sends a command for the wireless controllers 2310 to change settings to the values saved in the memory of the wireless controllers 2310 based on the capacitive button pressed. As an example, button 1 may send command 1 telling the lights, or other connected device(s), to go to the scene values stored in memory on the wireless controller 2310 for scene 1. Preferably, the wireless controllers 2310 are transmit only devices to maintain an extremely long battery life. In some instances, the capacitive sensing is duty cycled. Such a duty cycle can save power and contribute to enabling a 25 year lifetime of the battery. As an example, the zones can be sensed once every quarter of a second or every eighth of a second. When a user is detected, wireless switch 2330 can transition from a first mode of detecting a user (User detection mode) to a second mode with faster sampling of the zones to ensure quick response to the user's commands (Run mode) or to implement a digital filter or digital calculation (signal processing) to analyze the detection. A microcontroller preferably takes several samples of the detection to avoid false triggers caused by noise sources such as AC wiring in close proximity. False detections may be ignored and the wireless switch 2330 may not transmit a packet due to the false detection. Zones 1-4 can be configured to each set a different scene within a room. As an example, Zone 1 can be configured to set wireless controllers 2310 to a 40% dim level. In such an example, the Zone 1 command can be sent from wireless switch 2330 to wireless controllers 2310 directly or through repeaters (not shown). In such an example, gateway 2360 can program wireless controllers 2310 with the desired state for each Zone command.

Wireless switch 2330 can be configured to turn the lights ON and OFF and also to dim the lights. In some embodiments, wireless switch 2330 can include a slider. By way of example, and with reference to FIG. 26B, a wireless switch 2630 can include a two element capacitive touch (sensing) slider 2632 (see FIG. 26B). Slider 2632 can allow the user to touch the top part of the switch to turn the lights ON. Slider 2632 can allow the user to touch the bottom part of the switch to turn the lights OFF. In between the ON and OFF zones, the user can slide their finger to adjust the dim level of the lights. In some instances, the user need not physically touch wireless switch 2630. In such instances, the capacitive sensing can be sensitive such that the user's finger can be sensed within several millimeters of the sensing surface of wireless switch 2632.

As discussed above, wireless switch 2330 can be a transmit-only device configured to transmit commands on two or more sequential channels using a single radio. As an example, wireless switch 2330 can transmit on a first channel (e.g., "Channel A") followed by second channel (e.g., "Channel B"). Wireless switch 2330 can be mounted to a wall, can be a mobile device (movable about a room), or can be mounted in a cradle that is secured to the wall with fasteners, such as a screws, such that wireless switch 2330 can be removed from the cradle. Wireless switch 2330 can be associated with a unique serial number that is assigned at the time of manufacture and that is included as data within every packet transmitted.

Wireless switch 2330 is preferably constructed using two or more printed circuit board (PCB) in a stacked configuration. The PCBs are preferably parallel planes and are preferably connected using one or more PCB to PCB board level connector. Preferably, the top PCB contains the capacitive touch pads for sensing a change in capacitance caused by the presence of a person's finger. The traces for the capacitive pads to the capacitive touch module, which may be integrated into the microcontroller, may run from the top PCB to the bottom PCB through the one or more board level connector. The top PCB containing the cap touch buttons is preferably mounted in a manner to provide contact with an outer plastic wall of a housing. Preferably, the mounting securely pushes the PCB against the outer plastic wall without a significant air gap. Preferably, the two or more PCBs are each two or more layers.

The wireless switch 2330 includes an antenna for communication. The antenna is preferably constructed on the capacitive touch PCB which is mounted in contact with an outer plastic wall of the housing. The antenna preferably in routed next to or within the capacitive touch buttons. In some embodiments, the antenna is designed to capacitively excite the capacitive touch buttons thereby making the capacitive touch buttons part of the antenna. Using the buttons as part of the antenna allows the buttons and antenna to share the same space on the PCB. The antenna frequency is set high enough not to interfere with the capacitive touch operation. Additionally, the feedpoint for the antennas may use one or more of the connections on the board level connector. Preferably, the antenna is a DC short to enhance the performance of the capacitive touch buttons. As an example, the antenna may be a planar inverted-F antenna (PIFA) type antenna. One or more connections to the PIFA on a first PCB may be connected to the ground on a second PCB through the board level connector. One or more connections to the PIFA may be connected to the radio's output signal through the board level connections. Preferably, the board level connector connection spacing is designed to have a specific characteristic impedance to aid in antenna matching. The antenna may include a passive resonating element as part of the antenna on the second PCB to increase the bandwidth of the antenna. The passive resonating element preferably has no physical connection to the radio signal and is only connected to the ground on the second PCB.

Wireless switch 2330 may be used to control the operation of other devices other than lights, such as motors and other devices. The levels between ON and OFF may be used to change a parameter of the device such as the speed, volume, flow, or other measurable quantity.

Figure 24:
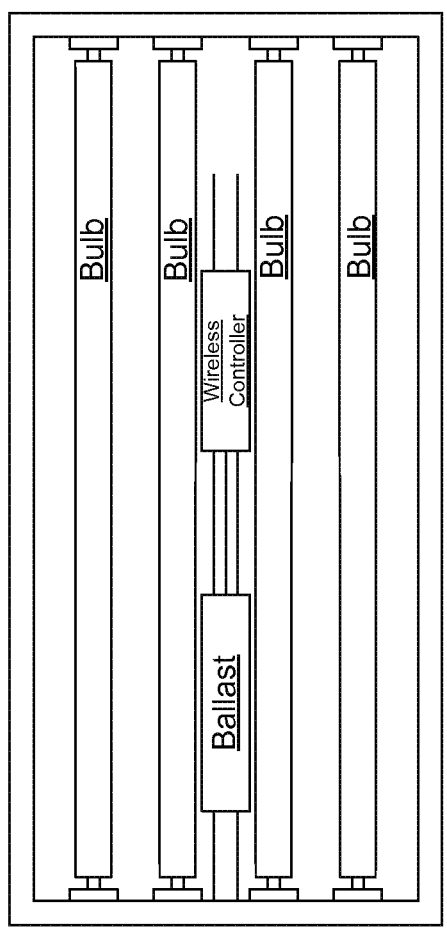
FIG. 24 is a schematic illustration of a portion of a lighting control system according to an embodiment.

Wireless controller 2310 can be configured to control one or more lighting fixtures 2320 and communicate with the BAS. In some instances, wireless controller 2310 can be an AC or DC line powered device. Wireless controller 2310 can be configured, during normal operation, to receive data from wireless switch 2330, gateway 2360, motion sensors 2340, and/or light sensors 2350, and control the status of light fixture 2320. Wireless controller 2310 can turn lights within light fixture 2320 ON or OFF or dim a light level. By way of example, and with reference to FIG. 24, light fixture 2320 can include multiple bulbs 2324 controlled by a ballast 2322 and wireless controller 2310 can interface with ballast 2322. In such an instance, wireless controller 2310 can include a mechanism for making or breaking the AC or DC line power to ballast 2322. In such instances, mechanism can be a latching relay to limit the amount of power used by wireless controller 2310; alternatively, the mechanism can be a non-latching relay or other solid-state relay or switch.

In some instances, wireless controller 2310 can be queried from gateway 2360 to join a BAS network. Wireless controller 2310 can be enrolled into the BAS network when the user scans or manually enters a bar code of wireless controller 2310 into a webpage associated with gateway 2360 or the cloud server(s). Wireless controller 2310 can then transmit to gateway 2360 the unique identification number of gateway 2360, which can be included with packets transmitted from wireless controller 2310. Additionally, wireless controller 2310 can receive association data from gateway 2360. In such an instance, the association data can indicate to wireless controller 2310 which system devices (e.g., switches, sensors, etc.) will be providing data to wireless controller 2310. As an example, gateway 2360 can indicate to wireless controller 2310 to receive signals from one or more wireless switches 2330. Once this association is stored in wireless controller 2310's non-volatile memory, wireless controller 2310 can directly receive data or commands from the one or more wireless switches 2330 and act upon the data or commands received. In some instances, wireless controller 2310 can receive commands from gateway 2360. Gateway 2360 can set the frequency channel of wireless controller 2310. As an example, wireless controller 2310 can be set to Channel A to receive data from sensors 2340 or switches 2330 on Channel A (first sequential transmission from sensors 2340 or switches 2330) or wireless controller 2310 can be set to Channel B to receive data from sensors 2340 or switches 2330 on Channel B (second sequential transmission from sensors 2340 or switches 2330).

In some instances, wireless controller 2310 can be enabled as a repeater to repeat packets from other devices (e.g., wireless switches, sensors, other wireless controllers, etc.). In such instances, wireless controller 2310 can track the packets received to ensure the same packet is not transmitted more than once. In such instances, wireless controller 2310 can also add the gateway unique identification number to the packet to indicate to other repeating wireless controllers (not shown) that the packet has already been repeated and also that the packet is only repeated by wireless controllers associated with the gateway whose unique identification number is contained in the packet. In some instances, diagnostic data can be added to the packet to monitor the health of the network including hop count, received signal strength, packet counter, etc. In certain instances, wireless controller 2310 will only repeat packets of devices stored in memory and are associated to wireless controller 2310. In some instances, for example, when wireless controller 2310 is configured in a non-repeater mode of operation, wireless controller 2310 can ignore any packets except those from associated devices stored in memory (e.g., wireless switches, sensors, etc.) and gateway 2360. The channel for repeater mode can be set by the gateway (Channel A or Channel B), which can allow the network to have two redundant overlapping networks. As an example, the user can instruct gateway 2360 to enable one wireless controller 2310 in a room to be on repeater Channel A and another wireless controller 2310 in a room to be on repeater Channel B. In some instances, a repeater can sequentially transmit on all channels.

In some instances, wireless controller 2310 can default to ON after a power outage to ensure that light is restored until the user via wireless switch 2330 or gateway 2360 change the status of wireless controller 2310 (e.g., ON, OFF, or dim). Wireless controller 2310 may be mounted within or on a light fixture 2320 or light fixture assembly. In many instances, light fixture 2320 can be constructed of metal, which can pose a challenge for the RF communications. In such instances, the antennas described above in FIGS. 17-22 can be used to overcome these challenges. As an example, light fixture 2320 can be a 2 foot by 2 foot drop ceiling light fixture, wireless controller 2310 can use a wire antenna (not shown). A printed circuit board (PCB) (not shown) can contain a ground plane for the antenna. Wireless controller 2310 can be mounted using an adhesive tape (not shown). The antenna is designed to protrude through a hole in the top of the light fixture 2320 and into the space above the drop ceiling. The antenna can be orthogonal to the top of the light fixture. The top of the light fixture can act as a ground plane for the antenna. The PCB ground plane and light fixture metal can capacitively couple to form a virtual ground for the antenna.

In some instances, wireless controller 2310 can include connectors for quick connection and disconnection from the mains (AC or DC) (e.g., the mains discussed above with reference to FIGS. 10-15) without the need to switch off the connection to the fixture at the breaker panel. Additionally, the connectors can allow for additional wires to allow daisy chaining of the AC or DC mains or control signals such as dimming signals to the next wireless controller. Each wireless controller 2310 can be associated with a unique serial number that can be assigned at time of manufacture that is included as data within every packet transmitted.

Wireless controller 2310 can perform dimming using a 0-10V signal. Wireless controller 2310 can, for example, source a 0-10V signal (output) or receive a 0-10V signal (input) using the same circuitry. This can be achieved by using a driver output that can source or sink current to hold the output at the proper voltage level.

Motion sensor 2340 can be configured to sense the motion of an occupant of a space. In some instances, motion sensor 2340 can be a battery operated device. In such instances, a battery (not shown) of motion sensor 2350 can be coupled to an energy harvester as described herein. In some instances, motion sensor 2340 can be a transmit-only device. In other instances, motion sensor 2340 can be configured to receive information from other devices of system 2300. In instances where motion sensor 2340 is configured as a transmit-only device, a battery (not shown) of motion sensor 2340 can last 25 years or more. In some instances, motion sensor 2340 can have no moving parts. In such instances, the lack of moving part can increase the usable lifetime of the motion sensor 2340. In some instances, motion sensor 2340 can use passive infrared to indicate the presence of an individual with the sensing area. In some instances, motion sensor 2340 can sample motion at a nearly continuous rate. In such instances, motion sensor 2340 can balance sensing time with energy usage (battery life). Motion sensor 2340 can be configured to provide continuous sensing while still achieving 25 years or more of operation from a single pre-installed (e.g., soldered) battery. In some instances, a 25 year battery life is achieved without energy harvesting. When motion is detected, motion sensor 2340 triggers an output signal and resets to enable sensing again. During the reset process, motion sensor 2340 may be unable to sense motion. The reset process, however, can only take about one second and because motion has just been sensed, one second of non-sensing time can be a non-factor.

In some instances, motion sensor 2340 can be configured to transmit a packet when motion is detected. In such an instance, motion sensor 2340 can continue to sense motion but, in some instances, does not transmit another packet for a pre-determined or programmable time period such as five minutes. In such an instance, motion sensor 2340 effectively continuously monitors motion during five minute windows (or any other suitable window of time) and can send a packet indicating if motion occurred during the five minute period. In some instances, motion sensor 2340 can send data to the gateway and/or the wireless controller 2310. Control based on or in response to the packet can be performed by gateway 2360 and/or wireless controller 2310. In some instances, motion sensor 2340 can be used to sense occupancy or vacancy of a room or area. Motion sensor 2340 may be ceiling, wall, or hallway mounted.

In some instances, motion sensor 2340 can be a transmit-only device that can transmit data on two sequential channels using a single radio. As an example, motion sensor 2340 can transmit on Channel A followed by Channel B. Each motion sensor 2340 can have a unique serial number that is assigned at time of manufacture that is included as data within every packet transmitted.

Light sensor 2350 can be configured to sense a level of ambient light in a space and can be configured to transmit such information for control and/or configuration of light fixtures 2320. In some instances, light sensor 2350 can be a battery operated device. In some instances, light sensor 2350 can be configured, during normal operation, to be a transmit-only device. In other instances, light sensor 2350 can be configured to receive information from system 2300. In instances where light sensor 2350 is configured as a transmit-only device, a battery (not shown) of light sensor 2350 can last 25 years or more. In some instances, light sensor 2350 can have no moving parts. In such instances, the lack of moving part can increase the usable lifetime of the light sensor 2350. In some instances, light sensor 2350 can include a lens, IR and UV filters, and a photodiode configured to measure the lux level striking the surface on which light sensor 2350 is mounted. A light sensing element (not shown) within light sensor 2350 can be designed to closely match a light frequency (spectral) response of the human eye. The light sensor may also include a mounting device to hold one or more of the photodiode, filters, and lens. The mounting device may also be designed to block substantially all the light other than the light entering through the lens. This eliminates error caused by light that may enter the light sensor enclosure other than through the lens. Preferably the lens, filters, and photodiode have a cosine square light transfer response to mimic the human eye.

In some instances, light sensor 2350 can be configured to sample the light level (e.g. lux level) and send an RF packet at a predetermined or programmable time, such as, for example, once per minute or on a condition of light level change of a percentage of the previous reading. In some instances, light sensor 2350 can send data to gateway 2360 or wireless controllers 2310. In such instances, this data can be used to adjust the light level in a room to drive the light level to a desired level. In some instances, a range of light levels can be provided, for example, user-defined, including a maximum acceptable light level (maximum set point/lux level) and a minimum acceptable light level (minimum set point/lux level). The system can modify the dim level of wireless controllers 2310 associated with light sensor 2350 to drive the light level to in between the minimum and maximum set points. As an example, the minimum lux level for a room can be set to 300 lux and the maximum lux level can be set to 400 lux. If light sensor 2350 reports to gateway 2360 that the current lux level in a room is 350 lux, gateway 2360 can make no change to the dim level of the wireless controllers within the room. If, however, light sensor 2350 reports that the lux level is 250 lux, gateway 2360 can instruct one or more or all of wireless controllers 2310 within the room to increase the dim level by a certain percentage (e.g. 10%). In some instances, when a subsequent reading from the light sensor 2350 is received, gateway 2360 can continue to turn up the dim setting until light sensor 2350 sends a reading between 300 and 400 lux. The same process can occur if the lux level is above 400 lux except gateway 2360 can instruct one or more or all of wireless controllers 2310 to decrease the dim level by a certain percentage (e.g. 10%) until the lux level is between the user-defined set points of 300 and 400 lux.

In some instances, light sensor 2350 can be a transmit-only device that can transmit data on two sequential channels using a single radio. As an example, light sensor 2350 can transmit on Channel A followed by Channel B. Each light sensor 2350 can have a unique serial number that is assigned at time of manufacture that is included as data within every packet transmitted.

Gateway 2360 can be configured to connect wireless switch 2330, light sensor 2350, motion sensor 2340, wireless controllers 2310 and associated light fixtures 2320 with a BAS network. Gateway 2360 can be similar to the network gateway devices described herein, for example, network gateway device 140. In some instances, gateway 2360 can collect data from all devices on gateway 2360's network. A user can enroll devices to the network associated with gateway 2360 using a webpage served from gateway 2360 to a user's computer over the LAN (not shown). In this manner, the webpage can allow the user to enroll devices by scanning the bar codes of the unique identification numbers of the devices using a bar code scanner (not shown). The user can also set characteristics of the device (e.g. wireless switches, wireless sensors, wireless controllers, etc.) using the webpage. The user can also use the webpage to associate one device to another. All of this data can be stored in non-volatile memory in gateway 2360 to ensure retention during a power outage and to reduce system latency to and from the cloud server. In some instances, associations can tell devices how to interact with one another. As an example, wireless controllers 2310 are associated with wireless switch 2330. In such an example, wireless controllers 2310 receive and process packets from wireless switch 2330 to control the ON, OFF, or dim state. This data can also be relayed to gateway 2360 to ensure proper system control and to double check that wireless controllers received and acted upon the command.

In some instances, gateway 2360 can group devices by room or area. As an example, referring to FIG. 23, all devices (e.g., wireless controllers 2310, wireless switch 2330, motion sensor 2340, light sensor 2350, etc.) have been added to the room. In this example, wireless controllers 2310 would be associated to wireless switch 2330, and motion sensors 2340 and light sensor 2350 would be associated to the room.

In some instances, motion sensors are used to reset the room timeout. The room timeout timer can indicate when to switch from an occupied state to an unoccupied state. The room timeout timer can be user configurable and can be, for example, thirty minutes. The room timeout timer can be timed by gateway 2360 in an individual room and can be used by gateway 2360 to make decisions on how to control the room devices (e.g. wireless controllers 2310). Data that indicates motion, sent from motion sensors 2340, can reset the room timer of the room shown in FIG. 23. In some instances, each room or area has a dedicated room timer and timeout condition. In some instances, either motion sensor 2340 can sense motion and clear the room timer. In some instances, once the room timer reaches the room timeout condition, such as 30 minutes, gateway 2360 can issue to wireless controllers 2310 a command associated with that room to switch to the desired state of wireless controller 2310. In such instance, the command to wireless controllers 2310 can occur sequentially to each wireless controller 2310 or as a single command simultaneously to all wireless controllers 2310. In such instances, typically the desired state is OFF; in some instances, however, certain lighting, such as security lighting or emergency lighting can have a desired state of ON or dimmed to a settable level such as 50%. In some instances, light sensor 2350 can continuously monitor the light level in the room and send data to gateway 2360. Gateway 2360 can wirelessly send commands to wireless controllers 2310 based on the sensor data (from motion sensors 2340 and light sensor 2350). In some instances, motion sensors 2340 and/or light sensor 2350 can communicate directly with wireless controllers 2310 if found to be advantageous, and associations can be stored for motion sensors 2340 and/or light sensors 2350 in wireless controllers 2310.

In some instances, gateway 2360 can set device data such as but not limited to, sensing thresholds, timeouts, dim levels, etc. This data is used by gateway 2360 to perform or ensure system control.

In some instances, gateway 2360 can maintain a schedule for each room or for whether the room should be occupied or unoccupied. The schedule can have, for example, a resolution of 15 minutes. In some instances, the schedule can be pushed to gateway 2560 from the cloud server and can be set by the user. In some examples, behavior under an occupied state may not match behavior in an unoccupied state. As an example, during an occupied state, lights may not go off due to a timeout condition but rather may just dim. Whereas, in an unoccupied state, the lights may shut off. At least a portion (24 hours as an example) of schedule can be stored on gateway 2360 to overcome network outages.

In some instances, gateway 2360 also includes an interface to the BAS to receive and provide control and monitoring information. In some instances, gateway 2360 can poll each wireless controller 2310 after a predefined time period to ensure that each wireless controller 2310 is in the proper state. In such instances, gateway 2310 can transmit a packet to correct any error found. As an example, gateway 2360 can poll one of 100 wireless controllers per second to check their state. Therefore, each wireless controller 2310 is polled every 100 seconds. In some instances, gateway 2360 can include two antennas and two radios simultaneously operating on different channels (Channel A and Channel B) to provide spatial and frequency diversity. In some instances, gateway 2360 can have a secure login and password for access from the user's computer or from the proxy or cloud server. In some instances, gateway 2360 can have the ability to perform a firmware upgrade when prompted by the cloud server and upon reception of a file containing the updated firmware. In some instances, gateway 2360 can backup its memory to the cloud server in case the gateway becomes inoperable. This can allow the user to restore the memory to a new gateway without the need to setup the system 2300 again.

As described above, a gateway can be a control point for a lighting control system and can be the central device for the configuration and monitoring of the system. The gateway can be a central point of control for other devices within the system. In some instances, however, the devices within the system can also function autonomously without the presence of the gateway. In such instances, in the event of a partial building power failure or interference where the gateway cannot communicate with the devices that it is configured to control, the devices can continue to function using default instructions and settings.

As described above, a gateway can be configured to control the initial configuration for devices (wireless controllers and associated lighting fixtures, motion sensors, lighting sensors, etc.). In such instances, the initial configuration can be accomplished by, for example, an Ethernet interface and a website that the user can load from the gateway to add or remove components or devices to or from the network. Additionally, devices in the system can be associated with a gateway via the cloud server. In some instances, the gateway can perform as a minimal control unit for all other lighting system hardware components or devices. In some instances, no scheduling is stored in gateway. In some instances, enabling or disabling of devices within the system can be done in a fixed manner via the gateway's web page interface or JSON REST interface to provide the mechanisms by which a given schedule or policy could be enacted. In some instances, the gateway is configured to push data to a proxy server, local server, and/or a cloud server as described herein. In some instances, the gateway can store information in memory about the associated devices (wireless controllers/repeaters, switches, sensors). In some instances, the gateway can upgrade software/firmware when prompted by a server. In such instances, a gateway can be configured to configure and control of new types of devices. In some instances, the gateway can use a network time protocol (NTP) client to poll an NTP server for the current time. In some instances, timestamps upon the gateway can be recorded as seconds as specified in the IEEE Std 1003.1-1988

Figure 25:
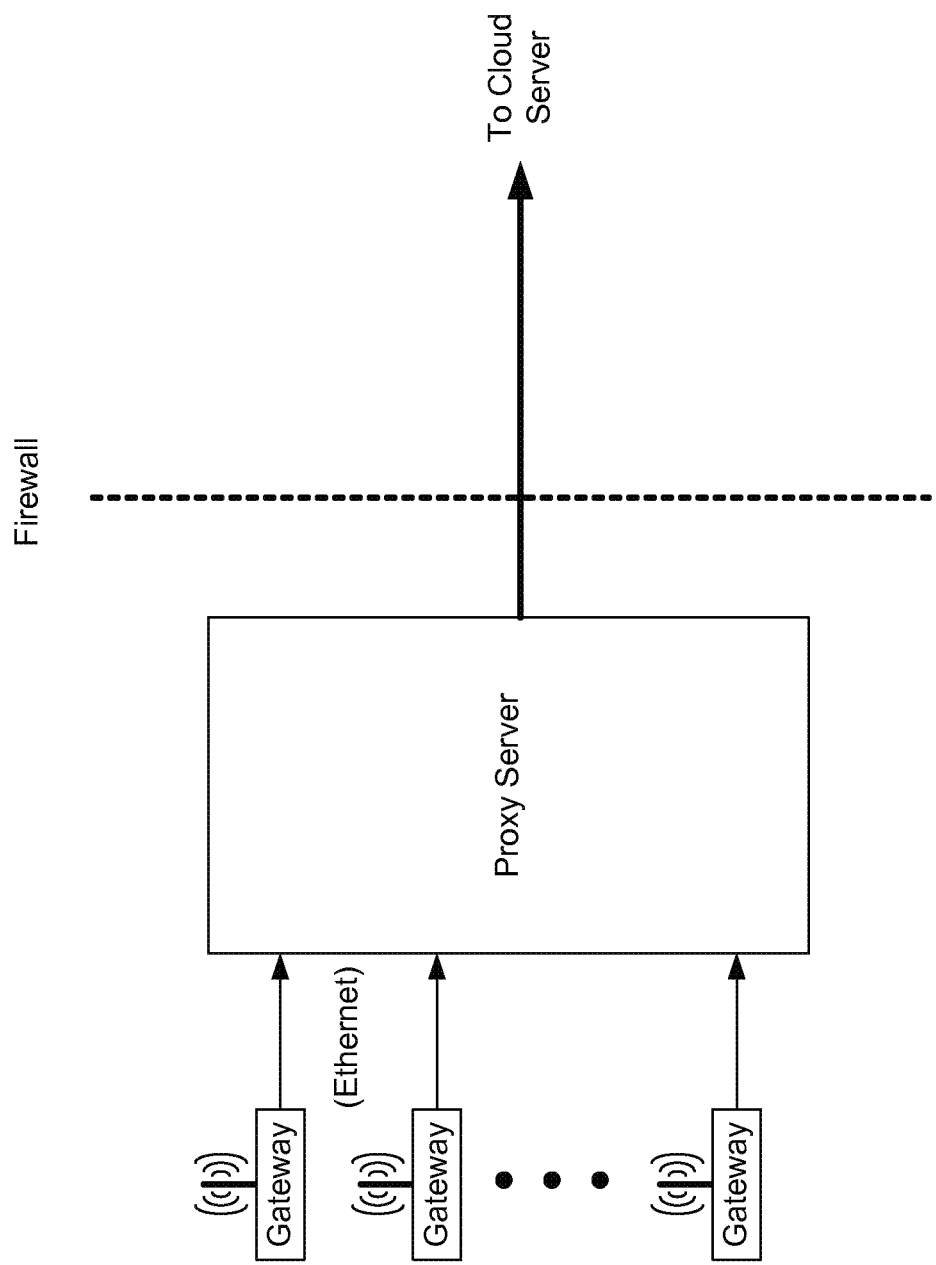
FIG. 25 is a schematic illustration of multiple gateways interfacing a proxy server connected to a cloud server according to an embodiment.

As shown in FIG. 25, a proxy server 2380 can be configured to aggregate data from multiple gateways 2360a-2360n on the wired network. The data from multiple gateways 2360a-2360n can then exit the firewall through a single point to minimize the security risk caused by the opening in the firewall as can be seen in FIG. 25. Additionally, proxy server 2380 can add additional security features to the system such as Client security socket layer (SSL) for added security. It should be noted that proxy server 2380 can be a physical unit, a software package, and/or a virtual machine running on an existing server.

A cloud server can be configured to aggregate data from multiple gateways and from multiple sites and from multiple users. In some instances, the cloud server can perform the same functions as a gateway but can also manage a complete site containing multiple gateways. The cloud server can also store, track, and analyze data. As an example, the cloud server can track energy usage of the lighting control system at the building, room/area, or wireless controller level. The user can enter the AC or DC voltage, typical current draw of the ballast, and the power factor. The cloud server could calculate the energy usage using this data and the ON time of the wireless controllers.

Devices described herein, for example, wireless switches, wireless sensors, etc., can each have a permanent bar code label and a removable adhesive bar code label. The removable bar code label can be removed during installation and adhered to a sheet that contains the devices with a room or area. These bar codes can be later scanned into a gateway at lighting control system setup. This can allow the gateway to know which devices should be added to the network and which device it should ignore (devices not scanned at setup).

In some instances, when multiple sensors are present in a room, the data from the sensors may be OR'ed, AND'ed, averaged, added, subtracted, integrated, or any other math operation to produce the desired result.

In some instances, multiple wireless switches can be associated with one or more wireless controllers to allow a room or area to have multiple switches for control. In such an instance, control can be based on the most recent switch press or by the switch with the highest priority within a timeout period. In some instances, a master switch that can control multiple rooms or areas and override any lower level switches contained within the rooms or areas.

Devices described herein can each have a unique serial number. The serial number can contain a portion that can be used to identify the type of device. As an example, the serial number may be a 32 bit number where the first 8 bits identify the type of device and the remaining 24 bits are a unique number.

In some instances, a lighting control system can employ encryption to ensure the system is secure. As added security the system can employ a packet counter and a data whitening algorithm. The packet counter can allow a gateway to ensure packets are not repeated by an attacker. The packet counter can also be used as a simple timestamp from the transmitting device or to determine if a packet from that device was missed or lost. This data can be used to request a retransmission, when applicable. The data whitening algorithm is used primarily to give RF frequency spectral spreading to comply with FCC regulations.

In some instances, a lighting control system can include additional devices such as but not limited to a wired switch, a wireless outlet, a controllable vent with electronically controlled louvers, HVAC sensors (temp, humidity, $CO_2$, differential pressure, contact closure, external temperature, pulse counters, etc.), voice-activated lighting controls, audio sensing occupancy or vacancy sensors.

In some instances, a gateway can include an additional radio to support the addition of other devices using a different protocol such as Zigbee or WiFi. In some instances, a gateway can include digital or analog inputs and/or outputs for connection to other systems to obtain other data for control. An example includes a connection to a security system to change the lighting settings based on a change in security status.

In some instances, a wireless controller can include a circuit to monitor current and power factor of the load to enable the wireless controller to report energy usage to the gateway and cloud server. Monitoring current can also be used to determine a malfunction in the load device such as a blown bulb or blown ballast.

Figure 27:
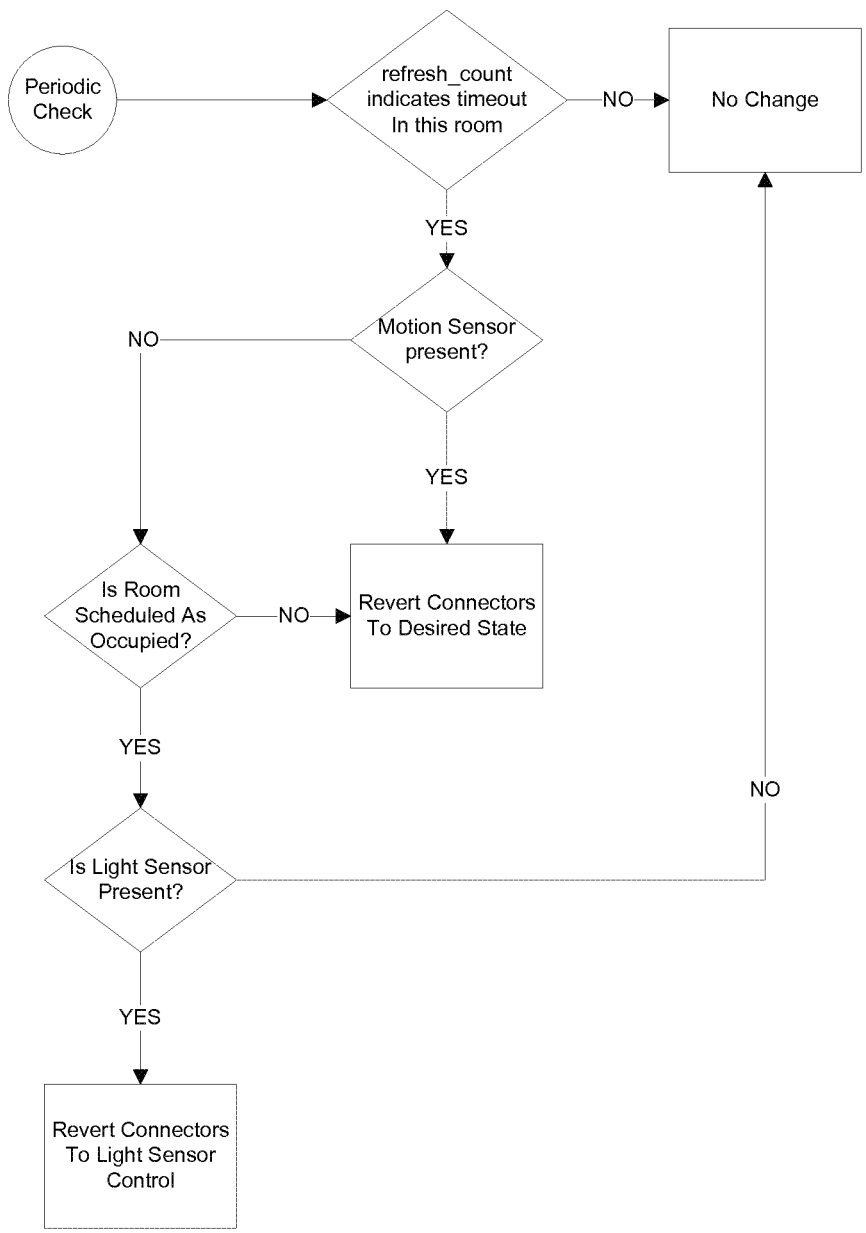
FIG. 27 is a schematic illustration of a flow chart of method of operating a lighting control system according to an embodiment.

FIG. 27 is a flowchart depicting a method 2700 of operating a lighting control system as described herein. Method 2700 includes a gateway associated with a space performing a periodic check, e.g., determining that whether or not a state change signal has been received during the time-out period for the space, at 2702, 2704. If the timeout period has passed without receiving a state change signal, method 2700 includes determining whether a motion sensor in present in the space, at 2706. If a motion sensor is present, method 2700 includes the gateway reverting any wireless controller to their desired state, at 2708. If no motion sensor is present, method 2700 includes the gateway determining whether the space is scheduled to be occupied, at 2710. If the space is not scheduled to be occupied, method 2700 includes the gateway reverting any wireless controller to their desired state, at 2708. If the room is scheduled to be occupied, method 2700 includes determining whether a light sensor is present, at 2712. If a light sensor is not present, method 2700 includes the gateway not initiating any change, at 2708. If a light sensor is present, method 2700 includes reverting any wireless controller to light sensor control, at 2714. Returning to 2704, if the timeout period has not passed, the gateway does not initiate any change, at 2716. While not shown in FIG. 7, after each of end points 2708, 2714 and 2716, method 2700 can return to 2702, performing a periodic check.

The lighting control systems described herein can be associated with different use cases. Specifically, the lighting control system can be associated with scenarios where a person interacts with the system physically (e.g., a switch) and/or via a device included in the system (e.g., motion sensor).

In scenarios where a person physically interacts with a switch, the switch allows the user to override the policy of the system. In the absence of a physical interaction by the user via switches or sensors, the system should behave autonomously according to a set policy.

In a first physical interaction scenario a user can desire more light. In this scenario, a setting can be in effect in which a light's off powered state or dimming level is too low for a user's need. The user can provide touch input to the switch based on their desired lighting level. In this scenario if the room in which the switch is pressed is set to occupied, then a room timeout can cause the wireless controllers to revert to day light harvesting, if a sensor exists. In this scenario if the room in which the switch is pressed is set to unoccupied, then a room timeout can cause the wireless controllers to revert to the default state of off as per the American Society of Heating, Refrigerating and Air Conditioning Engineers (ASHRAE) standards.

In a second physical interaction scenario a user can desire less light. In this scenario a room can have a schedule in effect that sets the defaults of a room wireless controller's state. A user can prefer to have a darker room for a presentation. In this scenario, the user can provide touch input to the switch based on their desired lighting level. In this scenario if the room in which the switch is pressed is set to occupied, then a room timeout can cause the connectors to revert to day light harvesting, if a sensor is located in that room. In this scenario if the room in which the switch is pressed is set to unoccupied, then a room timeout can cause the connectors to revert to the default state of off as per the ASHRAE standards.

In a third physical interaction scenario, switches can be disabled via deletion of its wireless controller associations. In such a scenario, a user's physical interaction with a switch can override the system. Similarly, if a switch times out, the user can also override the switch.

In a fourth physical interaction scenario, a gateway can lose connectivity. In such a scenario the switches can act as the singular point of control of the system. The wireless controllers within a room should act autonomously as a single unit and remain in the state that they were in prior to loss of connectivity. Because the building policy can be controlled via broadcasts from the gateway, all building policies that are in effect on the gateway will not be available for access by other devices upon failures and switch state will be persistent until connectivity is restored within the system.

In a first motion sensor scenario, no motion is detected. In such a scenario, in the event that a building vacancy sensor detects that a room is vacant (no motion within a timeout period), all wireless controllers within the room will revert to their default state. In a motion second sensor scenario, motion is detected. In such a scenario, in the event of motion being detected the room will reset the timeout timer.

In a light sensor scenario, a light sensor is placed in a room so that it can detect a room lux level. In such a scenario, given a configurable lux set point of the sensor, the system can dim or brighten the wireless controllers associated with a sensor. In such a scenario, the switches associated with the wireless controllers can override the default state that is set for daylight harvesting. In such a light sensor scenario, the lux point or brightness of the room as measured by the light sensors can be controlled via the gateway. This system can be designed to provide a reasonable value of light and adaptation to changing light conditions as determined by testing. Continuing with this scenario, hysteresis levels are given for a wireless controller-to-light-sensor association. These levels can provide a range of lux in which the wireless controllers associated with a light sensor may not attempt to adjust their percent diming.

As described herein a gateway can be connected to a lighting control system. By way of example, a technician can connect an Ethernet cable into the gateway. The Ethernet connection can be able to function without a need for cross over cables. A technician can then enable communication to the gateway by setting a static internet protocol (IP) address on the technician's computer. Continuing with this example, a technician can then navigate to a Hypertext Transfer Protocol Secure (HTTPS) server on the gateway at the gateway's default IP and can be prompted for a default username and password. After entering a default username and password, the technician can be required to enter in a username and password before proceeding. If no username or password is provided, the gateway will not be configurable or usable. In such an example, this can be a security mechanism.

As described herein, network settings of a lighting control system can be configured. For example a technician can change the default IP address and LAN settings (domain name server (DNS), IP Gateway, subnet mask) to match the desired network settings. A technician can enter in the gateway information to an associated cloud or proxy server. If the gateway is set to push updates to a cloud server, an associated username and password for the cloud server can be entered into the gateway either by the installer or a cloud server/proxy. A technician can install the gateway into the permanent location as a LAN fixture. A technician can log into a cloud server or proxy and confirm that the gateway has been recognized/perform additional configuration upon that server.

As described herein, a resource provides access to a representation of gateway configuration or current state via HTTP requests and responses. The gateway can be designed to be polled for data using HTTP requests to URLs representing resources and to return responses to those requests. Additionally, because state changes to different resource parameters can be missed between subsequent polls to the representational state transfer (REST) interface, an additional interface can be provided that can allow for pushing of state changes to an external server. Unless populated or configured by a user or an external server via the REST interface, the gateway will return empty array responses for all resources except the gateway and schedule.

While various embodiments, instances and implementations described herein describe a particular number of wireless switches, wireless controllers, wireless sensors, wireless repeaters, and/or network gateway devices, etc., wireless sensor systems and lighting control systems described herein can include any number of such devices, for example, to provide redundancy. By way of example, a multi-story building can include a network gateway device on a top floor and on a bottom floor, and each wireless sensor can include at least one path, via wireless repeaters to the network gateway device on the top floor and/or on the bottom floor.

In any of the embodiments, the device may use an F-like antenna. The antenna is preferably constructed on a PCB. The PCB may have two or more layers. Preferably, a ground plane is formed on a bottom layer while the components and antenna are formed on a top layer. The antenna in some embodiments may have at least one conductor that is constructed as an arch. Preferably, the shorting pin of the antenna and the feed point of the antenna intersection on the arch and at a non-orthogonal angle. The antenna may also contain multiple parallel segments at the end of the arch. The parallel segments are electrically connected at alternating ends to form a meander section. The antenna preferably has no ground plane directly underneath substantially all of the antenna. The antenna shorting pin preferably is orthogonal to the end of the ground plane for a portion of its length and is curved for a portion of its length and without an abrupt angle like 90 degrees.

If found to be advantageous, the transmitted data packets may include: Hop count, RSSI, Last repeater ID, or other data for monitoring the health of the wireless network.

In any of the embodiments, the device may include a bi-stable display or other indicator to allow the user to see the status of function of a device. As an example, the motion sensor may include an LED that illuminates when motion is sensed. As another example, the light sensor may include a bi-stable segmented display to display the current reading of the lux level on the sensor along with the transmission of that data to the gateway.

While various embodiments, instances and implementations of the invention are described herein, it should be understood that they have been presented by way of example only, and not limitation. Where methods described herein indicate certain events occurring in certain order, the ordering of certain events may be modified. Additionally, certain of the events may be performed concurrently in a parallel process when possible, as well as performed sequentially as described above.

In some embodiments, instances and implementations, the devices can include or relate to a computer storage product with a non-transitory computer-readable medium (also can be referred to as a non-transitory processor-readable medium) having instructions or computer code thereon for performing various computer-implemented operations. The computer-readable medium (or processor-readable medium) is non-transitory in the sense that it does not include transitory propagating signals per se (e.g., a propagating electromagnetic wave carrying information on a transmission medium such as space or a cable). The media and computer code (also can be referred to as code) may be those designed and constructed for the specific purpose or purposes. Examples of non-transitory computer-readable media include, but are not limited to: magnetic storage media such as hard disks, floppy disks, and magnetic tape; optical storage media such as Compact Disc/Digital Video Discs (CD/DVDs), Compact Disc-Read Only Memories (CD-ROMs), and holographic devices; magneto-optical storage media such as optical disks; carrier wave signal processing modules; and hardware devices that are specially configured to store and execute program code, such as Application-Specific Integrated Circuits (ASICs), Programmable Logic Devices (PLDs), Read-Only Memory (ROM) and Random-Access Memory (RAM) devices.

Examples of computer code include, but are not limited to, micro-code or micro-instructions, machine instructions, such as produced by a compiler, code used to produce a web service, and files containing higher-level instructions that are executed by a computer using an interpreter. For example, embodiments may be implemented using Java, C++, or other programming languages (e.g., object-oriented programming languages) and development tools. Additional examples of computer code include, but are not limited to, control signals, encrypted code, and compressed code.

Although various embodiments, instances and implementations are described herein as having particular features and/or combinations of components, other embodiments are possible having a combination of any features and/or components from any of the embodiments where appropriate.

We claim:

1. An apparatus, comprising:
a wireless device configured to be operatively coupled to a wireless controller that receives at least one of a first data packet or a second data packet from the wireless device,
the wireless device configured to send the first data packet at a first time on a first frequency, the first data packet including a payload,
the wireless device configured to send the second data packet at a second time on a second frequency different from the first frequency, the second data packet including a payload corresponding to the payload of the first data packet,
the wireless device including a display configured to indicate at least one of a value of a set point associated with the wireless controller or a status associated with the wireless controller.

2. The apparatus of claim 1, wherein the second time is after the first time and without substantial delay between an end of the first time and a start of the second time.

3. The apparatus of claim 1, wherein the payload is associated with a value of a measurement that was measured by the wireless device.

4. The apparatus of claim 1, wherein:
the payload is associated with a value of a measurement that was measured by the wireless device; and
the display is configured to indicate the value of the measurement that was measured by the wireless device.

5. The apparatus of claim 1, wherein the payload is associated with a value of a temperature measurement that was measured by the wireless device.

6. The apparatus of claim 1, wherein the payload is associated with a value of a humidity measurement that was measured by the wireless device.

7. The apparatus of claim 1, wherein the payload is associated with a value of a lux level measurement that was measured by the wireless device.

8. The apparatus of claim 1, wherein:
the payload is associated with a value of a measurement that was measured by the wireless device, and
the wireless device is configured to send the first data packet if the wireless device determines that the value of the measurement varies from a previously-measured value by at least a predetermined amount.

9. The apparatus of claim 1, wherein the wireless device includes a memory configured to store one or more set points, the one or more set points configured to be set via user interaction with the wireless device.

10. The apparatus of claim 1, wherein:
the wireless device includes a memory configured to store one or more set points, the one or more set points configured to be set via user interaction with the wireless device,
the wireless device includes a capacitive button, the capacitive button configured such that a physical interaction between the capacitive button and a user's finger sets at least one of the one or more set points.

11. The apparatus of claim 1, wherein the display is a bi-stable display.

12. The apparatus of claim 1, wherein the wireless device includes an input component, the wireless device configured such that a user's physical interaction with the input component overrides the status associated with the wireless controller.

13. The apparatus of claim 1, wherein the wireless device includes a plurality of zones, each zone from the plurality of zones associated with a command from a plurality of commands, the wireless device configured to transmit the command associated with a particular zone of the plurality of zones to adjust the status associated with the wireless controller in response to a user's physical interaction with that particular zone.

14. The apparatus of claim 13, wherein the command from the plurality of commands and associated with each zone from the plurality of zones is associated with a set of lighting values associated with that zone and stored in a memory of the wireless controller, and the status associated with the wireless controller is a brightness of a light source associated with the wireless controller.

15. The apparatus of claim 13, wherein each zone from the plurality of zones includes a capacitive sensor from a plurality of capacitive sensors, the wireless device configured to operate in a first mode at a first sample rate, the wireless device configured to operate in a second mode at a second sample rate upon sensing a change in capacitance via a capacitive sensor from the plurality of capacitive sensors, the second sample rate being faster than the first sampling rate, the wireless device configured to analyze a plurality of samples of a capacitance level of a particular zone of the plurality of zones to determine whether detection of the user's physical interaction was a false detection.

16. The apparatus of claim 1, wherein the wireless device includes a first printed circuit board and a second printed circuit board, the first printed circuit board including a capacitive touch pad, the second printed circuit board coupled to the first printed circuit board such that a trace couples the capacitive touch pad of the first printed circuit board to a microprocessor via the second printed circuit board, the capacitive touch pad configured to sense a change in capacitance caused by a presence of a user's finger near the capacitive touch pad.

17. The apparatus of claim 1, wherein the wireless device includes capacitive touch buttons and an antenna, the antenna configured to capacitively excite the capacitive touch buttons such that the capacitive touch buttons function collectively as part of the antenna.

18. The apparatus of claim 17, wherein the wireless device includes a first printed circuit board and a second printed circuit board, the first printed circuit board coupled to the second printed circuit board via a connector, the first antenna being an inverted F antenna, the first antenna being coupled to the first printed circuit board and a ground on the second printed circuit board via the connector.

19. The apparatus of claim 17, wherein the antenna includes at least one conductor that is shaped as an arch, the antenna including a shorting pin and a feed point, the shorting pin and the feed point coupled to the arch at a non-orthogonal angle relative to the arch.

20. The apparatus of claim 19, wherein the antenna can include a plurality of parallel segments on an end portion of the at least one conductor, a first segment of the plurality of parallel segments coupled to a second segment of the plurality of parallel segments via a first end portion of the first segment, the first segment coupled to a third segment of the plurality of parallel segments via a second end portion of the first segment.

21. A system, comprising:
a wireless device configured to send a first data packet at a first time on a first frequency and a second data packet at a second time on a second frequency different from the first frequency, the first data packet including a payload, the second data packet including a payload corresponding to the payload of the first data packet; and
a wireless controller configured to be operatively coupled to the wireless device, the wireless controller configured to receive at least one of the first data packet or the second data packet from the wireless device,
the wireless device including a display configured to indicate at least one of a value of a set point associated with the wireless controller or a status associated with the wireless controller.

22. The system of claim 21, further comprising a network gateway device operatively coupled to at least one of the wireless device or the wireless controller.

23. The system of claim 21, further comprising:
a network gateway device operatively coupled to at least one of the wireless device or the wireless controller, and
the wireless device is configured to send the first data packet and the second data packet independent of an instruction from the network gateway device.

24. The apparatus of claim 21, wherein the second time is after the first time, without substantially delay occurring between an end of the first time and a start of the second time.

25. The system of claim 21, wherein the wireless device can include a motion sensor.

26. The system of claim 21, wherein the wireless device can include a temperature sensor.

27. The system of claim 21, wherein the wireless device can include at least one of a light switch or an outlet switch.

28. An apparatus, comprising:
a wireless device configured to be operatively coupled to a wireless controller that receives at least one of a first data packet or a second data packet from the wireless device,
the wireless device configured to send the first data packet at a first time on a first frequency, the first data packet including a payload,
the wireless device configured to send the second data packet at a second time on a second frequency different from the first frequency, the second data packet including a payload corresponding to the payload of the first data packet,
the wireless device including a memory configured to store at least one of one or more set points or a status of the wireless controller,
the wireless device including a display configured to indicate at least one of a value of a set point of the one or more set points or the status of the wireless controller,
the wireless device including an input component configured to receive, via a user interaction, input such that at least one of the one or more set points or the status of the wireless controller is set based on the input.

29. The apparatus of claim 28, wherein the display is bi-stable.

* * * * *